(12) United States Patent
Choi

(10) Patent No.: US 11,348,647 B2
(45) Date of Patent: May 31, 2022

(54) MEMORY DEVICE AND METHOD OF OPERATING THE SAME

(71) Applicant: SK hynix Inc., Icheon-si (KR)

(72) Inventor: Young Hwan Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 30 days.

(21) Appl. No.: 17/096,687

(22) Filed: Nov. 12, 2020

(65) Prior Publication Data

US 2021/0391017 A1 Dec. 16, 2021

(30) Foreign Application Priority Data

Jun. 16, 2020 (KR) ........................ 10-2020-0073166

(51) Int. Cl.
*G11C 16/04* (2006.01)
*G11C 16/16* (2006.01)
*H01L 27/11582* (2017.01)
*H01L 27/11556* (2017.01)

(52) U.S. Cl.
CPC .......... *G11C 16/16* (2013.01); *G11C 16/0483* (2013.01); *H01L 27/11556* (2013.01); *H01L 27/11582* (2013.01)

(58) Field of Classification Search
CPC ................................................ G11C 16/0483
USPC .................................................... 365/185.17
See application file for complete search history.

(56) References Cited

U.S. PATENT DOCUMENTS

2015/0270005 A1* 9/2015 Choi ........................ G11C 8/18
365/185.11

FOREIGN PATENT DOCUMENTS

KR 1020190128403 A 11/2019
KR 1020210072276 A 6/2021

* cited by examiner

*Primary Examiner* — Jason Lappas
(74) *Attorney, Agent, or Firm* — William Park & Associates Ltd.

(57) ABSTRACT

A memory device includes: a first string including a plurality of first memory cells, and a first select transistor connected between a first conductive line and the plurality of first memory cells; a second string including a plurality of second memory cells, and a second select transistor connected between the first conductive line and the plurality of second memory cells; a peripheral circuit configured to perform an erase operation of the first and second strings; and control logic. The control logic is configured to control the peripheral circuit to, during the erase operation, apply a first erase voltage to the first conductive line, float a first select line connected to the first select transistor after the first erase voltage is applied, and float a second select line connected to the second select transistor after the first select line is floated.

20 Claims, 17 Drawing Sheets

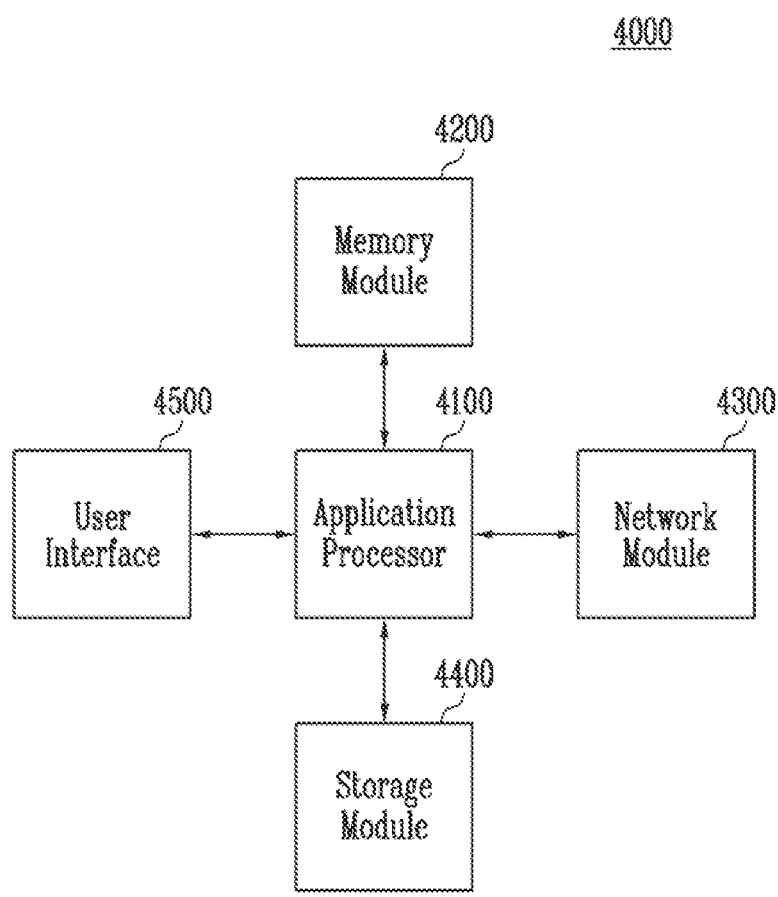

MEMORY DEVICE AND METHOD OF OPERATING THE SAME

CROSS-REFERENCE TO RELATED APPLICATION

The present application claims priority under 35 U.S.C. § 119(a) to Korean patent application number 10-2020-0073166, filed on Jun. 16, 2020, in the Korean Intellectual Property Office, the entire disclosure of which is incorporated herein by reference.

BACKGROUND

1. Technical Field

The present disclosure relates to an electronic device, and more particularly, to a memory device and a method of operating the memory device.

2. Related Art

A storage device is a device that stores data under the control of a host device, such as a computer or a smartphone. The storage device may include a memory device in which data is stored and a memory controller for controlling the memory device. The memory device may be classified as a volatile memory device or a non-volatile memory device.

A volatile memory device is a device that stores data only when power is supplied and loses the stored data when the supplied power is interrupted. A volatile memory device may include, for example, static random access memory (SRAM), dynamic random access memory (DRAM), and the like.

A non-volatile memory device is a device that does not lose data in the absence of power. A non-volatile memory device may include, for example, read only memory (ROM), programmable ROM (PROM), electrically programmable ROM (EPROM), electrically erasable and programmable ROM (EEPROM), flash memory, and the like.

SUMMARY

A memory device according to an embodiment of the present disclosure may include: a first string including a plurality of first memory cells, and a first select transistor connected between a first conductive line and the plurality of first memory cells; a second string including a plurality of 15 second memory cells, and a second select transistor connected between the first conductive line and the plurality of second memory cells; a peripheral circuit configured to perform an erase operation of the first and second strings; and control logic. The control logic is configured to control the peripheral circuit to, during the erase operation, apply a first erase voltage to the first conductive line, float a first select line connected to the first select transistor after the first erase voltage is applied, and float a second select line connected to the second select transistor after the first select line is floated.

A memory device according to an embodiment of the present disclosure may include: a first string including a plurality of first memory cells, and a first select transistor connected between a first conductive line and the plurality of first memory cells; a second string including a plurality of second memory cells, and a second select transistor connected between a second conductive line and the plurality of second memory cells; a peripheral circuit configured to perform an erase operation of the first and second strings; and control logic. The control logic is configured to control the peripheral circuit to, during the erase operation, apply an erase voltage to the first and second conductive lines, float a first select line connected to the first select transistor after the erase voltage is applied, and float a second select line connected to the second select transistor after the first select line is floated.

A memory device according to an embodiment of the present disclosure may include a plurality of memory blocks. Each of the plurality of memory blocks may include a plurality of strings, and each of the plurality of strings may include a plurality of memory cells and a select transistor connected between a conductive line and the plurality of memory cells. The memory device may also include an erase speed information storage configured to store information on an erase speed of the plurality of strings; a peripheral circuit configured to perform an erase operation of erasing data stored in the memory cells included in the plurality of strings; and control logic configured to control the peripheral circuit to float select lines respectively connected to the select transistors included in the plurality of strings, based on the information on the erase speed, during the erase operation.

A memory device and the method of operating the memory device, according to an embodiment, may compensate for an erase speed difference of memory cell strings.

BRIEF DESCRIPTION OF THE DRAWINGS

FIG. 17 is a block diagram illustrating a user system to which the storage device according to an embodiment of the present disclosure is applied.

DETAILED DESCRIPTION

Specific structural or functional descriptions of embodiments according to the concept which is disclosed in the present specification or application are illustrated only to describe the embodiments according to the concept of the present disclosure. The embodiments according to the concept of the present disclosure may be carried out in various forms and the descriptions are not limited to the embodiments described in the present specification or application.

Hereinafter, embodiments of the present disclosure will be described with reference to the accompanying drawings so that those skilled in the art may easily implement the technical spirit of the present disclosure.

An embodiment of the present disclosure provides a memory device capable of compensating for an erase speed difference among memory cell strings, also referred to as memory strings or simply strings, and a method of operating the memory device.

Figure 1:
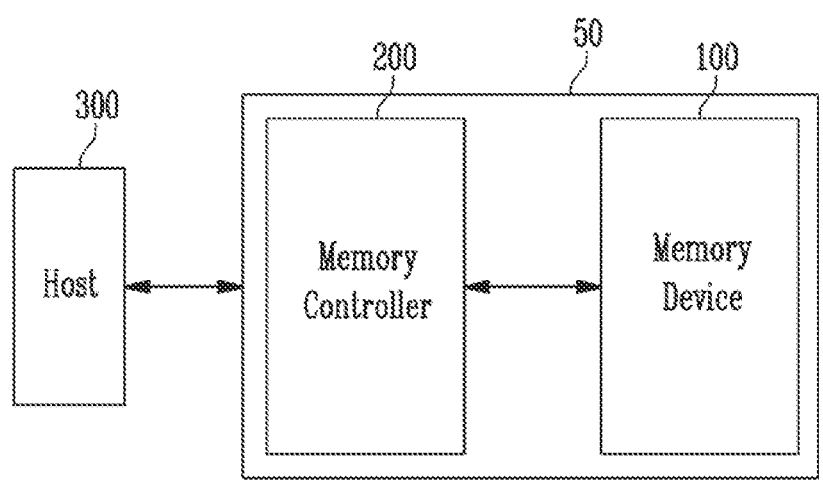
FIG. 1 is a block diagram illustrating a configuration of a storage device according to an embodiment of the present disclosure.

FIG. 1 is a block diagram illustrating a configuration of a storage device according to an embodiment of the present disclosure.

Referring to FIG. 1, the storage device 50 may include a memory device 100 and a memory controller 200.

The storage device 50 may be a device that stores data under the control of a host 300 such as a cellular phone, a smartphone, an MP3 player, a laptop computer, a desktop computer, a game player, a TV, a tablet PC, or an in-vehicle infotainment system.

The storage device 50 may be manufactured as one of various types of storage devices according to a host interface that is a communication method with the host 300. For example, the storage device 50 may be configured as any one of various types of storage devices such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured as any one of various types of packages. For example, the storage device 50 may be manufactured as a package on package (POP), a system in package (SIP), a system on chip (SOC), a multi-chip package (MCP), a chip on board (COB), a wafer-level fabricated package (WFP), or a wafer-level stack package (WSP).

The memory device 100 may store data. The memory device 100 operates under the control of the memory controller 200. The memory device 100 may include a plurality of planes. The plane may be a region that may independently operate. Each plane may independently perform any one of a program operation, a read operation, and an erase operation.

The memory device 100 may include a memory cell array including a plurality of memory cells that store data. The memory cell array may include a plurality of memory blocks. The memory block may include a plurality of memory cells. The memory block may be a unit that performs the erase operation of erasing data stored in the memory device 100. That is, data stored in the same memory block may be simultaneously erased. In an embodiment, the memory block may include a plurality of pages. The page may be a unit for storing data in the memory device 100 or reading data stored in the memory device 100. That is, a physical address provided from the memory controller 200 to the memory device 100 during the program operation or the read operation may be an address for identifying a specific page.

In an embodiment, the memory device 100 may include double data rate synchronous dynamic random access memory (DDR SDRAM), low power double data rate4 (LPDDR4) SDRAM, graphics double data rate (GDDR) SDRAM, low power DDR (LPDDR), Rambus dynamic random access memory (RDRAM), NAND flash memory, vertical NAND flash memory, NOR flash memory device, resistive random access memory (RRAM), phase-change memory (PRAM), magnetoresistive random access memory (MRAM), ferroelectric random access memory (FRAM), spin transfer torque random access memory (STT-RAM), or the like. In the present specification, for convenience of description, it is assumed that the memory device 100 is a NAND flash memory device.

In an embodiment, the memory device 100 may be implemented in a three-dimensional array structure. The present disclosure may be applied not only to a flash memory device in which a charge storage layer is configured of a conductive floating gate (FG), but also to a charge trap flash (CTF) in which the charge storage layer is configured of an insulating layer.

In an embodiment, each of the memory cells included in the memory device 100 may be programmed as one of a single-level cell (SLC) that stores one data bit, a multi-level cell (MLC) that stores two data bits, a triple-level cell (TLC) that stores three data bits, or a quad-level cell (QLC) that stores four data bits.

The memory controller 200 may control an overall operation of the storage device 50. When power is applied to the storage device 50, the memory controller 200 may execute firmware (FW). When the memory device 100 is a flash memory device, the memory controller 200 may execute firmware such as a flash translation layer (FTL) for controlling communication between the host 300 and the memory device 100.

When a write request is input from the host 300, the memory controller 200 may receive a write data to be stored in the memory device 100 and a logical address (LA) for identifying corresponding write data from the host 300. The memory controller 200 may convert the input LA to a physical address (PA) indicating a physical address of memory cells in which the write data is stored among memory cells included in the memory device 100. In an embodiment, one PA may correspond to one physical page. The memory controller 200 may provide a program command, the physical address, and the write data for storing data to the memory device 100.

In an embodiment, when a read request is input from the host 300, the memory controller 200 may receive a logical address corresponding to the read request from the host 300. Here, the LA corresponding to the read request may be a LA identifying read requested data.

The memory controller 200 may obtain a PA mapped to the LA corresponding to the read request from map data indicating a correspondence relationship between the LA provided by the host 300 and the PA of the memory device 100.

In an embodiment, the memory controller 200 may control the memory device 100 to independently perform the program operation, the read operation, or the erase operation regardless of a request from the host 300. For example, the memory controller 200 may control the memory device 100 to perform background operations such as wear leveling, garbage collection, or read reclaim.

The host 300 may communicate with the storage device 50 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and a load reduced DIMM (LRDIMM).

Figure 2:
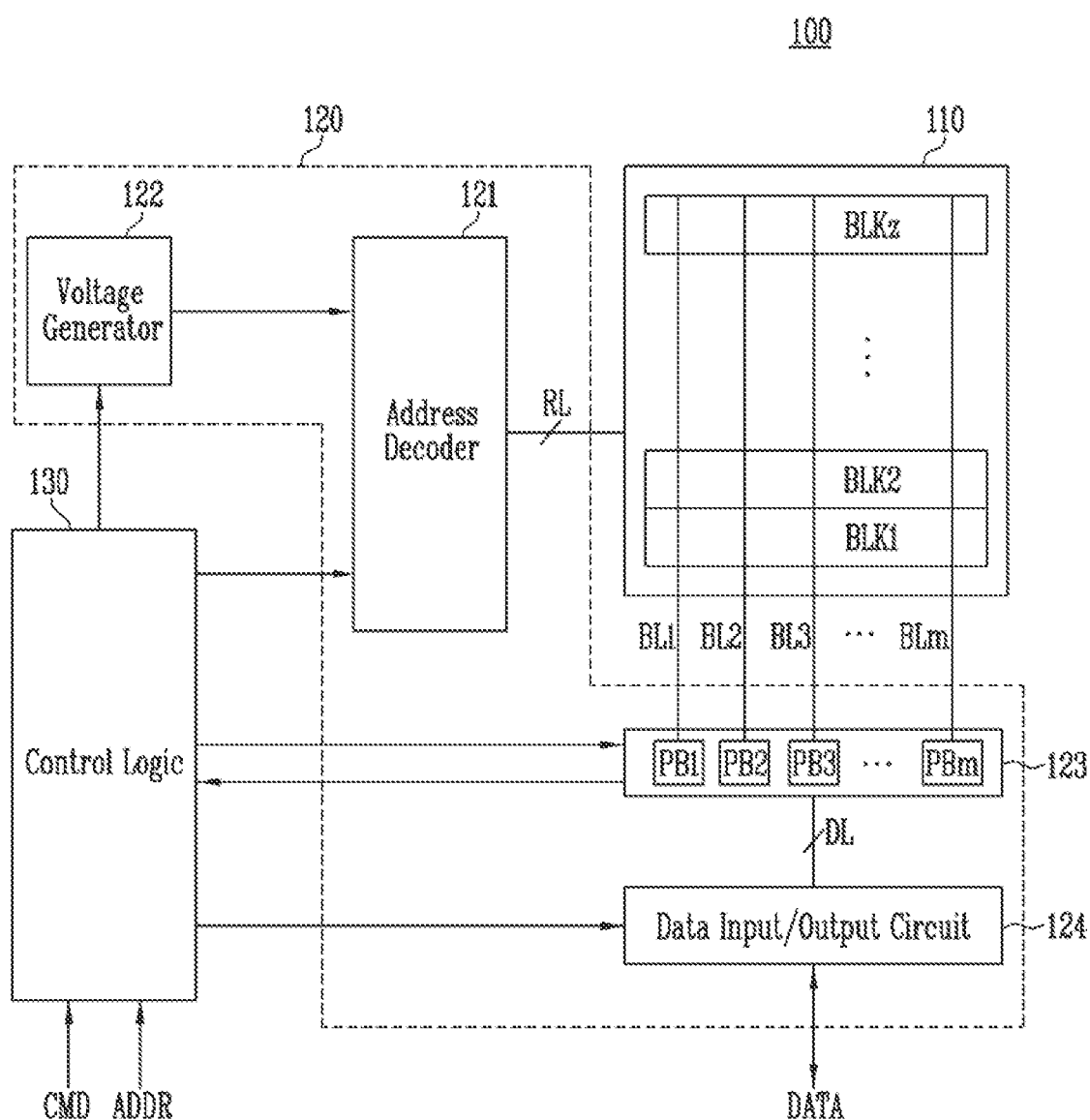
FIG. 2 is diagram illustrating a structure of a memory device of FIG. 1.

FIG. 2 is diagram illustrating a structure of the memory device 100 of FIG. 1.

Referring to FIG. 2, the memory device 100 may include a memory cell array 110, a peripheral circuit 120, and control logic 130.

The memory cell array 110 includes a plurality of memory blocks BLK1 to BLKz. The plurality of memory blocks BLK1 to BLKz are connected to an address decoder 121 through row lines RL and connected to a read and write circuit 123 through bit lines BL1 to BLm. The plurality of memory blocks BLK1 to BLKz are commonly connected to the first to m-th bit lines BL1 to BLm. Each of the plurality of memory blocks BLK1 to BLKz includes a plurality of memory cells.

In an embodiment, the plurality of memory cells may be non-volatile memory cells. The row lines RL may include at least one source select line, a plurality of word lines, and at least one drain select line. Memory cells connected to the same word line may be defined as one page. Therefore, one memory block may include a plurality of pages.

Each of the memory cells included in the memory cell array 110 may be configured as a single-level cell (SLC) that stores one data bit, a multi-level cell (MLC) that stores two data bits, a triple-level cell (TLC) that stores three data bits, or a quad-level cell (QLC) that stores four data bits.

The peripheral circuit 120 may be configured to perform the program operation, the read operation, or the erase operation on a selected region of the memory cell array 110 under control of the control logic 130. The peripheral circuit 120 may drive the memory cell array 110. For example, the peripheral circuit 120 may apply various operation voltages to the row lines RL and the first to m-th bit lines BL1 to BLm or discharge the applied voltages under the control of the control logic 130.

The peripheral circuit 120 may include the address decoder 121, a voltage generator 122, the read and write circuit 123, and a data input/output circuit 124.

The address decoder 121 may be connected to the memory cell array 110 through the row lines RL. The address decoder 121 may operate in response to control of the control logic 130. The address decoder 121 may receive an address from the control logic 130. In an embodiment, the address decoder 121 may decode a block address among the received addresses, and select any one of the plurality of memory blocks BLK1 to BLKz according to the decoded address. In an embodiment, the address decoder 121 may decode a row address among the received addresses and select any one word line among the selected memory blocks. The address decoder 121 may select row lines RL corresponding to the selected memory block, and transfer the operation voltages generated by the voltage generator 122 to the selected row lines RL.

Specifically, during the program operation, the address decoder 121 may apply a program voltage to a selected word line and apply a program pass voltage of a level lower than the program voltage to an unselected word line. During a program verify operation, the address decoder 121 may apply a verify voltage to the selected word line and a verify pass voltage higher than the verify voltage to the unselected word line. During the read operation, the address decoder 121 may apply a read voltage to the selected word line and apply a read pass voltage higher than the read voltage to the unselected word line.

In an embodiment, the erase operation of the memory device 100 is performed in a memory block unit. During the erase operation, the address decoder 121 may select one memory block according to the decoded address. During the erase operation, the address decoder 121 may apply a ground voltage to the word lines connected to the selected memory block.

In an embodiment, the address decoder 121 may further include an address buffer, a block decoder, a row decoder, and the like.

The voltage generator 122 may generate a plurality of voltages using an external power voltage supplied to the memory device 100. The voltage generator 122 operates in response to control of the control logic 130. For example, the voltage generator 122 regulates the external power voltage to generate an internal power voltage. The internal power voltage generated by the voltage generator 122 is provided to the address decoder 121, the read and write circuit 123, the data input/output circuit 124, and the control logic 130, and is used as an operation voltage of the memory device 100.

For example, the voltage generator 122 may generate a program voltage, a verify voltage, a program pass voltage, a verify pass voltage, a read voltage, an erase voltage, and the like under the control of the control logic 130.

In an embodiment, the voltage generator 122 may include a plurality of pumping capacitors to generate a plurality of operation voltages having various voltage levels. The voltage generator 122 may generate the plurality of operation voltages by selectively activating the plurality of pumping capacitors in response to control of the control logic 130. The generated plurality of operation voltages may be provided to the memory cell array 110 by the address decoder 121.

The read and write circuit 123 may include first to m-th page buffers PB1 to PBm. The first to m-th page buffers PB1 to PBm may be connected to the memory cell array 110 through the first to m-th bit lines BL1 to BLm, respectively. The first to m-th page buffers PB1 to PBm operate in response to control of the control logic 130. For example, the first to m-th page buffers PB1 to PBm may operate in response to page buffer control signals (not shown).

In an embodiment, the first to m-th page buffers PB1 to PBm may sense data stored in the memory cell array 110 by sensing a voltage or a current of the first to m-th bit lines BL1 to BLm. The first to m-th page buffers PB1 to PBm may temporarily store the sensed data. The first to m-th page buffers PB1 to PBm may provide the sensed data to the data input/output circuit 124 through data lines DL.

In an embodiment, the first to m-th page buffers PB1 to PBm may receive the data to be stored in the memory cell array 110 through the data lines DL from the data input/output circuit 124. The data received by the first to m-th page buffers PB1 to PBm through performance of the program operation may be stored in the memory cell array 110.

The program operation of storing the data in the memory cell may include a program voltage apply step and a verify step. In the program voltage apply step, while the program voltage is applied to the selected word line, the first to m-th page buffers PB1 to PBm may transfer the data to be stored to selected memory cells. A threshold voltage of the memory cell connected to the bit line to which a program permit voltage (for example, a ground voltage) is applied may increase. The threshold voltage of the memory cell connected to the bit line to which a program inhibit voltage (for example, a power voltage) is applied may be maintained. In the verify step of verifying the program operation, the first to m-th page buffers PB1 to PBm may sense the data stored in the memory cells through the first to m-th bit lines BL1 to BLm from the selected memory cells.

The data input/output circuit 124 may be connected to the first to m-th page buffers PB1 to PBm through the data lines DL. The data input/output circuit 124 operates in response to control of the control logic 130.

The data input/output circuit 124 may provide data DATA received from the memory controller 200 of FIG. 1 to the read and write circuit 123.

In an embodiment, the data input/output circuit 124 may include a plurality of input/output buffers (not shown) that receive the data DATA. During the program operation, the data input/output circuit 124 receives the data DATA, which is to be stored, from the memory controller 200. During the read operation, the data input/output circuit 124 may output the data, which is transferred from the first to m-th page buffers PB1 to PBm included in the read and write circuit 123, to the memory controller 200.

The control logic 130 is configured to control an overall operation of the memory device 100. The control logic 130 may receive a command CMD and an address ADDR. The control logic 130 may be implemented as hardware, software, or a combination of hardware and software. For example, the control logic 130 may be a control logic circuit operating in accordance with an algorithm and/or a processor executing control logic code.

Figure 3:
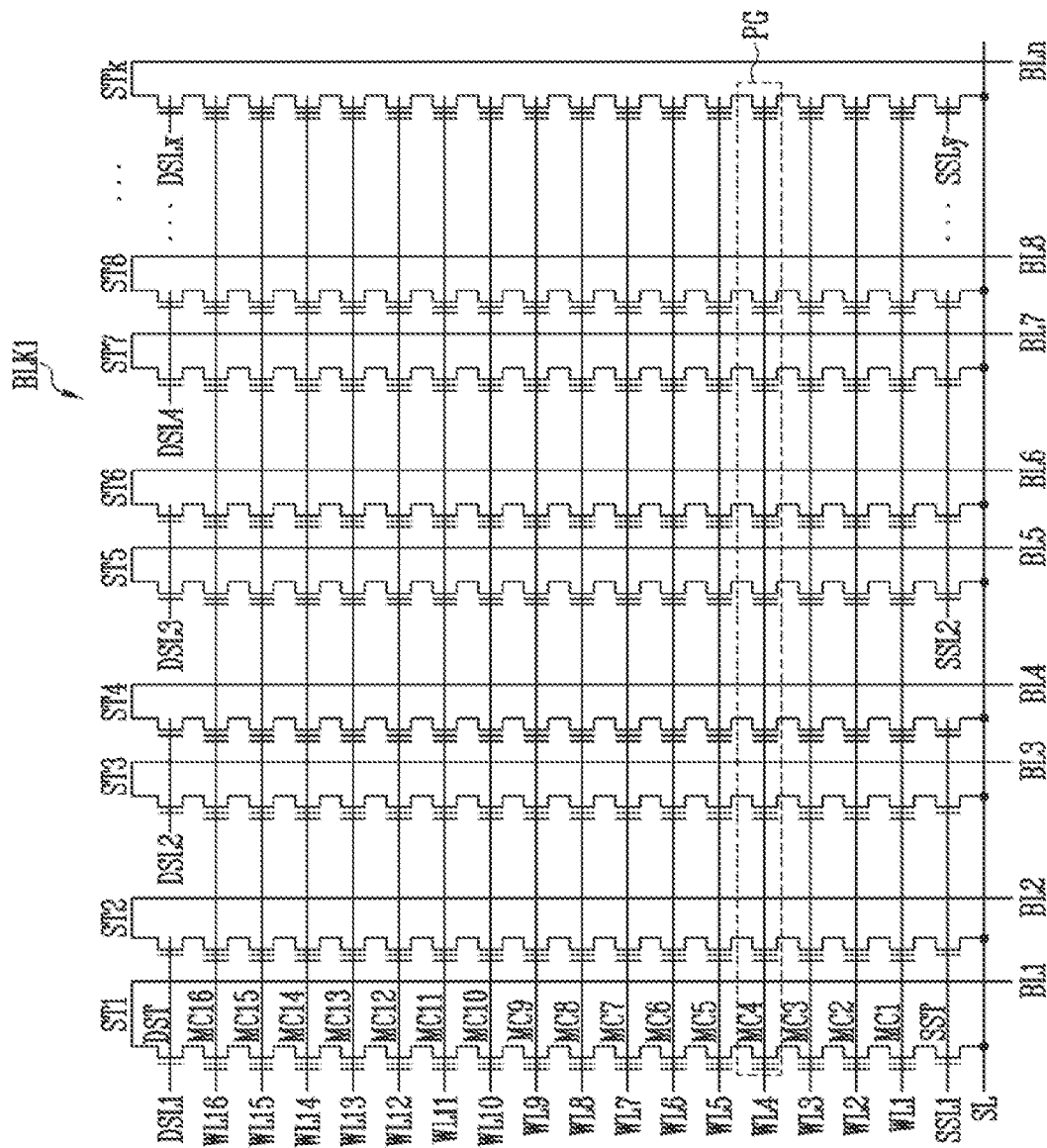
FIG. 3 is a diagram illustrating a structure of any one of memory blocks of FIG. 2.

FIG. 3 is a diagram illustrating a structure of any one of the memory blocks of FIG. 2.

Referring to FIG. 3, the memory block BLK1 may include a plurality of memory cells respectively connected to a plurality of word lines WL1 to WL16 arranged in parallel to each other between source select lines SSL1 to SSLy and drain select lines DSL1 to DSLx. More specifically, the memory block BLK1 may include a plurality of strings ST1 to STk connected between bit lines BL1 to BLn and a source line SL. The bit lines BL1 to BLn of FIG. 3 may be the first to m-th bit lines BL1 to BLm of FIG. 2.

In an embodiment, as shown, one of the strings ST1 to STk may be connected to one of the bit lines BL1 to BLn. In another embodiment, differently from that shown, several of the strings ST1 to STk may be connected to one of the bit lines BL1 to BLn.

The source line SL may be commonly connected to the strings ST1 to STk. Because the strings ST1 to STk may be configured similarly to each other, the string ST1 connected to the first bit line BL1 will be specifically described as an example.

The string ST1 may include a source select transistor SST, a plurality of memory cells MC1 to MC16, and a drain select transistor DST connected in series between the source line SL and the first bit line BL1. One string ST1 may include at least one or more of the source select transistor SST and the drain select transistor DST, and may include the memory cells MC1 to MC16 more than the number shown in the figure.

A source of the source select transistor SST may be connected to the source line SL and a drain of the drain select transistor DST may be connected to the first bit line BL1. The memory cells MC1 to MC16 may be connected in series between the source select transistor SST and the drain select transistor DST.

Gates of the source select transistors SST included in the strings ST1 to STk may be connected to the source select lines SSL1 to SSLy. Gates of the source select transistors SST included in the different strings ST1 to STk may be connected to one of the source select lines SSL1 to SSLy. For example, the gates of the source select transistors SST included in the first to fourth strings ST1, ST2, ST3, and ST4 may be connected to the first source select line SSL1, and the gates of the source select transistors SST included in the fifth to eighth strings ST5, ST6, ST7, and ST8 may be connected to the second source select line SSL2.

Gates of the drain select transistors DST included in the strings ST1 to STk may be connected to the drain select lines DSL1 to DSLx. Gates of the drain select transistors DST included in the different strings ST1 to STk may be connected to one of the drain select lines DSL1 to DSLx. For example, the gates of the drain select transistors DST included in the first and second strings ST1 and ST2 may be connected to the first drain select line DSL1, the gates of the drain select transistors DST included in the third and fourth strings ST3 and ST4 may be connected to the second drain select line DSL2, the gates of the drain select transistors DST included in the fifth and sixth strings ST5 and ST6 may be connected to the third drain select line DSL3, and the gates of the drain select transistors DST included in the seventh and eighth strings ST7 and ST8 may be connected to the fourth drain select line DSL4.

Gates of the memory cells MC1 to MC16 Included in the different strings ST1 to STk may be connected to the plurality of word lines WL1 to WL16. A group of memory cells connected to the same word line among memory cells included in the different strings ST1 to STk may be referred to as a physical page PG. Therefore, as many physical pages PG as the number of word lines WL1 to WL16 may be included in the memory block BLK1. In FIG. 3, the source lines SL, the source select lines SSL1 to SSLy, the word lines WL1 to WL16, and the drain select lines DSL1 to DSLx may be included in the row lines RL of FIG. 2.

When one memory cell is a single-level cell (SLC) storing 1 bit of data, one physical page PG may store one logical page (LPG) data. In addition, one memory cell may store two or more bits of data. In this case, one physical page PG may store two or more logical page (LPG) data.

Figure 4:
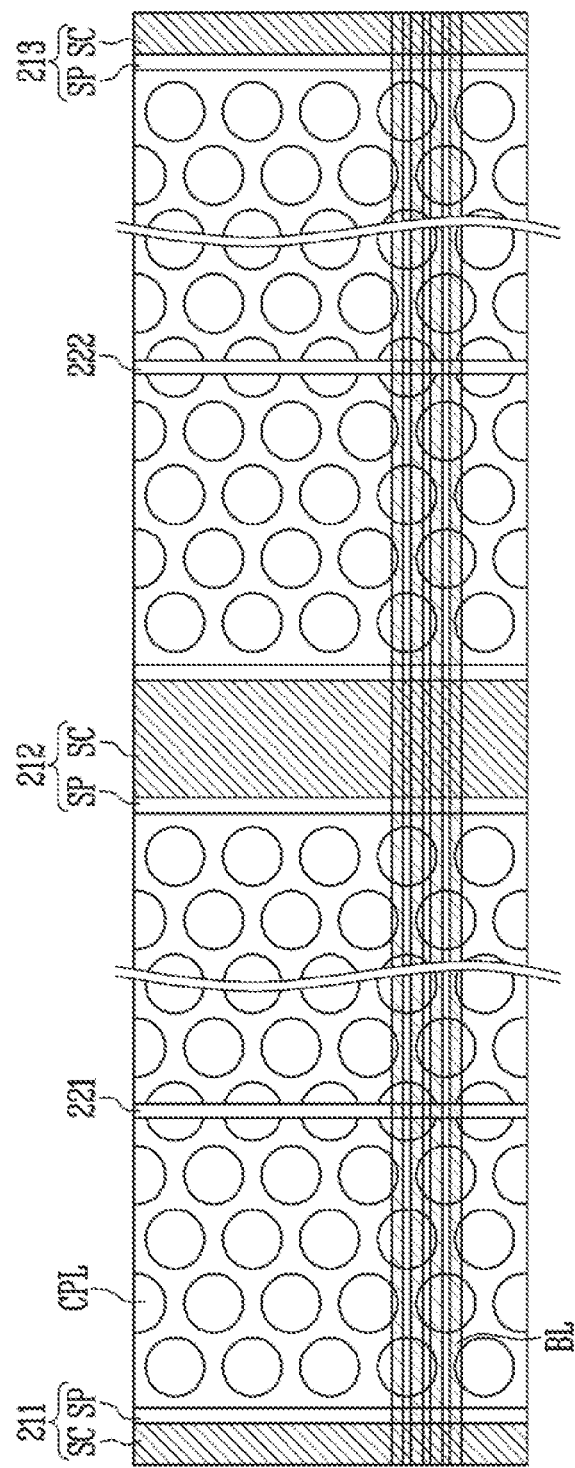
FIG. 4 is a plan view of a memory cell array according to an embodiment of the present disclosure.
Figure 5:
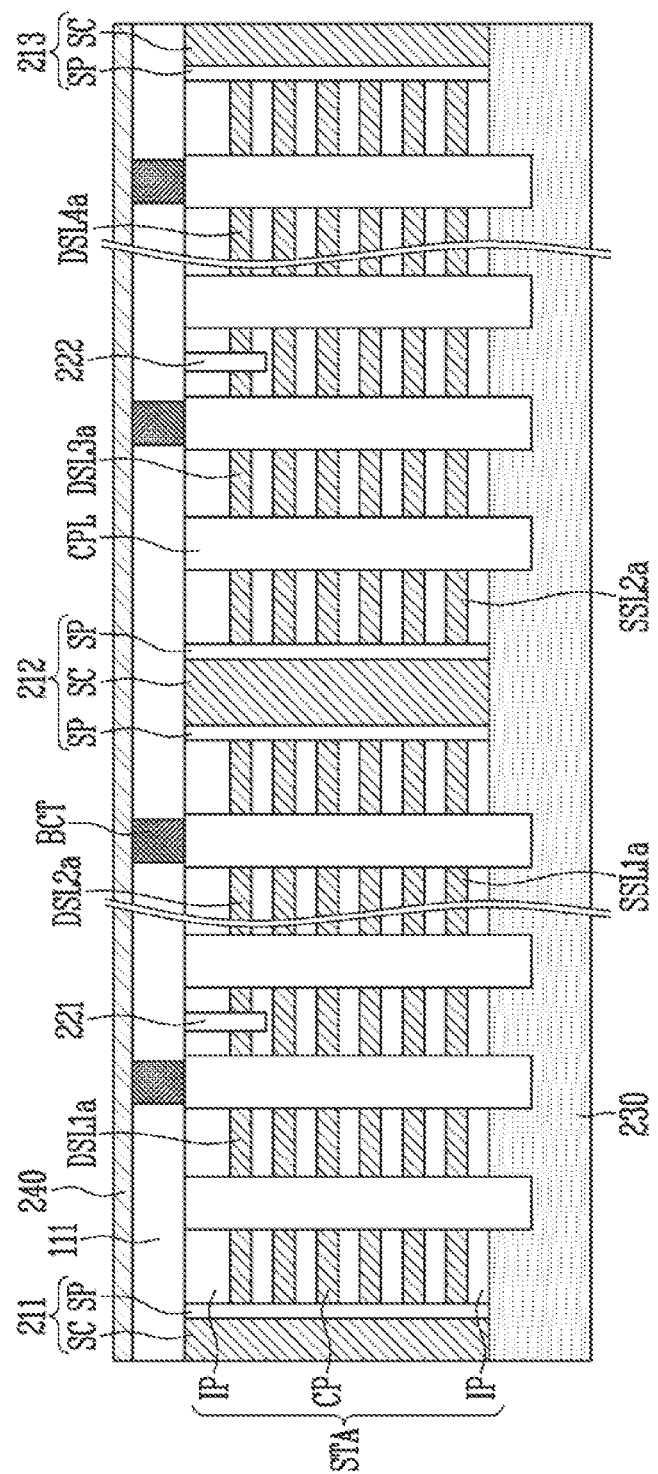
FIG. 5 is a cross-sectional view of the memory cell array according to FIG. 4.

FIG. 4 is a plan view of a memory cell array according to an embodiment of the present disclosure. FIG. 5 is a cross-sectional view of the memory cell array according to FIG. 4.

Referring to FIGS. 4 and 5, the memory cell array may include a source layer 230. The source layer 230 may include a conductive material. For example, the source layer 230 may include polysilicon.

A stack structure STA may be provided on the source layer 230. The stack structure STA may include conductive patterns CP and insulating patterns IP which are alternately stacked with each other. The conductive patterns CP may include a conductive material. The insulating patterns IP may include an insulating material. The conductive patterns CP may include a word line and a select line.

Cell plugs CPL passing through the stack structure STA may be provided. The cell plugs CPL may include a channel layer, a tunnel insulating layer surrounding the channel layer, a data storage layer surrounding the tunnel insulating layer, and a blocking layer surrounding the data storage layer.

First to third slit structures 211, 212, and 213 passing through the stack structure STA may be provided. Each of the first to third slit structures 211, 212, and 213 may include a source contact SC and spacers SP disposed on both sides of the source contact SC. The source contact SC may include a conductive material. The spacers SP may include an insulating material.

First and second separation layers 221 and 222 passing through a portion of the stack structure STA may be provided. The first separation layer 221 may be disposed between the first and second slit structures 211 and 212 adjacent to each other. The second separation layer 222 may be disposed between the second and third slit structures 212 and 213 adjacent to each other. The first and second separation layers 221 and 222 may include an insulating material.

An insulating layer 111 may be provided on the stack structure STA. The insulating layer 111 may include an insulating material.

Bit line contacts BCT passing through the insulating layer 111 may be provided. The bit line contacts BCT may be connected to the cell plugs CPL. The bit line contacts BCT may include a conductive material.

Bit lines 240 may be provided on the insulating layer 111. The bit lines 240 may be connected to the cell plugs CPL through bit line contacts BCT. The bit lines 240 may include a conductive material.

Among the conductive patterns CP of the stack structure STA, conductive patterns CP adjacent to the bit line 240 may be defined as first to fourth drain select lines DSL1a, DSL2a, DSL3a, and DSL4a.

The first and second drain select lines DSL1a and DSL2a may be disposed between the first and second slit structures 211 and 212 adjacent to each other. The first and second drain select lines DSL1a and DSL2a may be spaced apart from each other by the first separation layer 221. The first drain select line DSL1a may be disposed between the first slit structure 211 and the first separation layer 221. The second drain select line DSL2a may be disposed between the second slit structure 212 and the first separation layer 221.

The third and fourth drain select lines DSL3a and DSL4a may be disposed between the second and third slit structures 212 and 213 adjacent to each other. The third and fourth drain select lines DSL3a and DSL4a may be spaced apart from each other by the second separation layer 222. The third drain select line DSL3a may be disposed between the second slit structure 212 and the second separation layer 222. The fourth drain select line DSL4a may be disposed between the third slit structure 213 and the second separation layer 222.

Among the conductive patterns CP of the stack structure STA, conductive patterns CP adjacent to the source layer 230 may be defined as first and second source select lines SSL1a and SSL2a.

The first source select line SSL1a may be disposed between the first and second slit structures 211 and 212 adjacent to each other. The second source select line SSL2a may be disposed between the second and third slit structures 212 and 213 adjacent to each other.

The first source select line SSL1a may overlap the first and second drain select lines DSL1a and DSL2a. The second source select line SSL2a may overlap the third and fourth drain select lines DSL3a and DSL4a.

A plurality of strings included in the memory cell array may have different erase speeds. For example, strings between the first and second slit structures 211 and 212 and strings between the second and third slit structures 212 and 213 may have different erase speeds. As another example, strings between the first slit structure 211 and the first separation layer 221 and strings between the second slit structure 212 and the first separation layer 221 may have different erase speeds.

The erase speed may be an average speed of a plurality of erase operations. Alternatively, the erase speed may be a speed of the slowest erase operation among a plurality of erase operations.

The erase speed difference between strings may occur due to various reasons. For example, the erase speed difference between strings may occur according to a structural disposition of the strings. As another example, the erase speed difference between strings may occur according to variables of a manufacturing process of the memory cell array.

During the erase operation, time points when the respective first to fourth drain select lines DSL1a, DSL2a, DSL3a, and DSL4a are floated may be caused to be different from each other to compensate for the erase speed difference between strings.

During the erase operation, time points when the respective first and second source select lines SSL1a and SSL2a are floated may be caused to be different from each other to compensate for the erase speed difference between strings.

Figure 6:
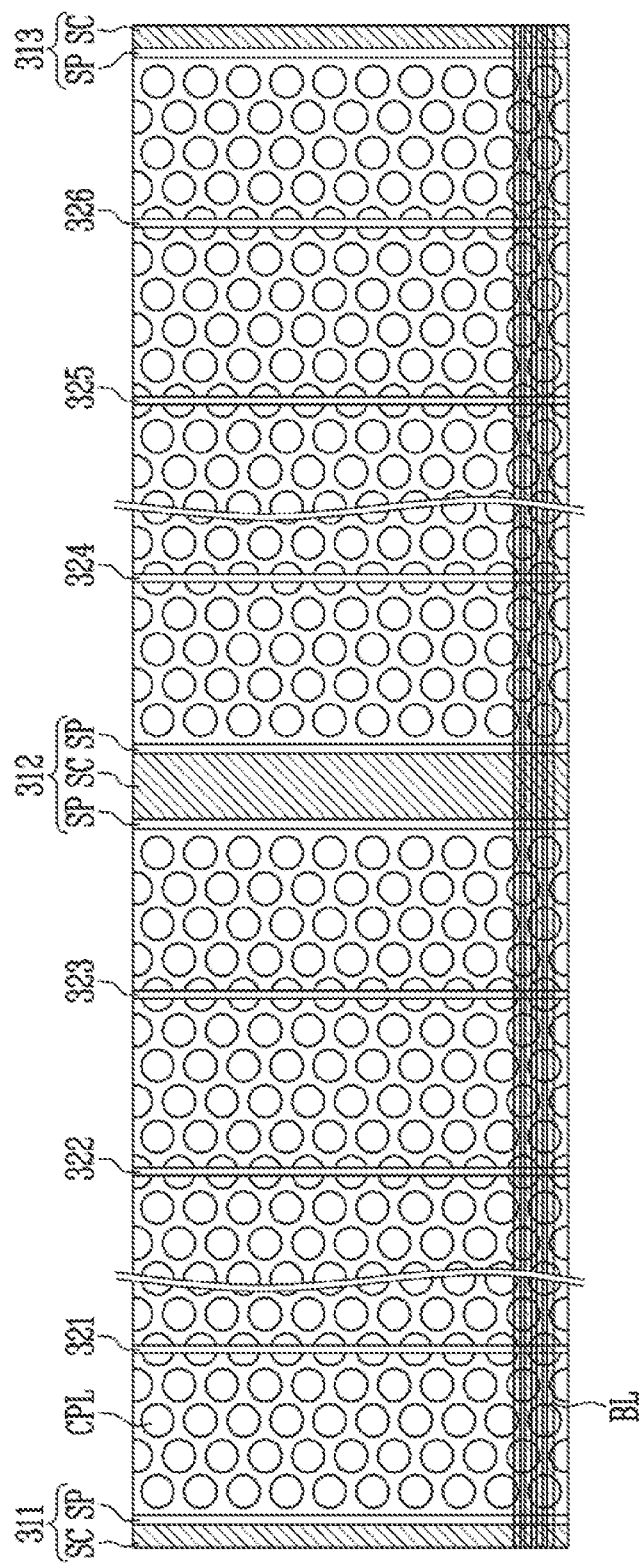
FIG. 6 is a plan view of a memory cell array according to an embodiment of the present disclosure.
Figure 7:
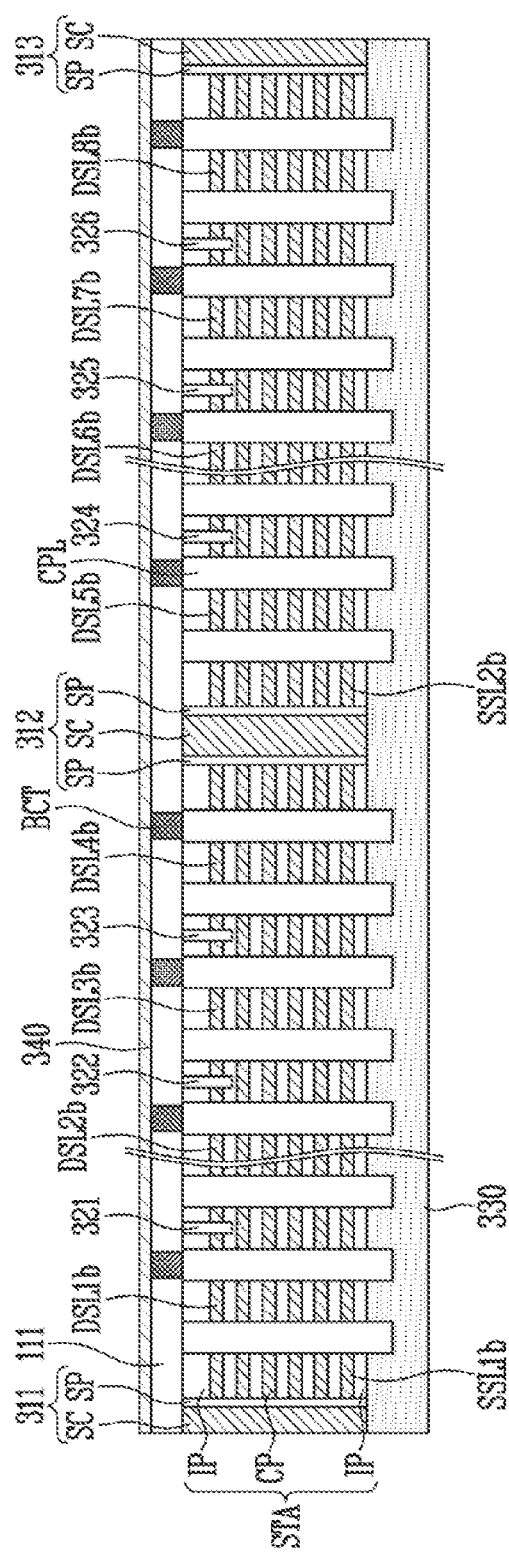
FIG. 7 is a cross-sectional view of the memory cell array according to FIG. 6.

FIG. 6 is a plan view of a memory cell array according to an embodiment of the present disclosure. FIG. 7 is a cross-sectional view of the memory cell array according to FIG. 6.

The memory cell array according to FIGS. 6 and 7 may be similar to the memory cell array according to FIGS. 4 and 5 except for that described below.

Referring to FIGS. 6 and 7, first to third slit structures 311, 312, and 313 passing through the stack structure STA may be provided.

First to sixth separation layers 321, 322, 323, 324, 325, and 326 passing through a portion of the stack structure STA may be provided. The first to third separation layers 321, 322, and 323 may be disposed between the first and second slit structures 311 and 312 adjacent to each other. The fourth to sixth separation layers 324, 325, and 326 may be disposed between the second and third slit structures 312 and 313 adjacent to each other.

Among the conductive patterns CP of the stack structure STA, the conductive patterns CP adjacent to a bit line 340 may be defined as first to eighth drain select lines DSL1b, DSL2b, DSL3b, DSL4b, DSL5b, DSL6b, DSL7b, and DSL8b.

The first to fourth drain select lines DSL1b, DSL2b, DSL3b, and DSL4b may be disposed between the first and second slit structures 311 and 312 adjacent to each other. The first and second drain select lines DSL1b and DSL2b may be spaced apart from each other by the first separation layer 321. The second and third drain select lines DSL2b and DSL3b may be spaced apart from each other by the second separation layer 322. The third and fourth drain select lines DSL3b and DSL4b may be spaced apart from each other by the third separation layer 323. The first drain select line DSL1b may be disposed between the first slit structure 311 and the first separation layer 321. The second drain select line DSL2b may be disposed between the first and second separation layers 321 and 322. The third drain select line DSL3b may be disposed between the second and third separation layers 322 and 323. The fourth drain select line DSL4b may be disposed between the second slit structure 312 and the third separation layer 323.

The fifth to eighth drain select lines DSL5b, DSL6b, DSL7b, and DSL8b may be disposed between the second and third slit structures 312 and 313 adjacent to each other. The fifth and sixth drain select lines DSL5b and DSL6b may be spaced apart from each other by the fourth separation layer 324. The sixth and seventh drain select lines DSL6b and DSL7b may be spaced apart from each other by the fifth separation layer 325. The seventh and eighth drain select lines DSL7b and DSL8b may be spaced apart from each other by the sixth separation layer 326. The fifth drain select line DSL5b may be disposed between the second slit structure 312 and the fourth separation layer 324. The sixth drain select line DSL6b may be disposed between the fourth and fifth separation layers 324 and 325. The seventh drain select line DSL7b may be disposed between the fifth and sixth separation layers 325 and 326. The eighth drain select line DSL8b may be disposed between the third slit structure 313 and the sixth separation layer 326.

Among the conductive patterns CP of the stack structure STA, the conductive patterns CP adjacent to the source layer 330 may be defined as first and second source select lines SSL1b and SSL2b.

The first source select line SSL1b may be disposed between the first and second slit structures 311 and 312 adjacent to each other. The second source select line SSL2b may be disposed between the second and third slit structures 312 and 313 adjacent to each other.

The first source select line SSL1b may overlap the first to fourth drain select lines DSL1b, DSL2b, DSL3b, and DSL4b. The second source select line SSL2b may overlap the fifth to eighth drain select lines DSL5b, DSL6b, DSL7b, and DSL8b.

The plurality of strings included in the memory cell array may have different erase speeds. For example, strings between the first and second slit structures 311 and 312 and strings between the second and third slit structures 312 and 313 may have different erase speeds. As another example, strings between the first slit structure 311 and the first separation layer 321 and strings between the first and second separation layers 321 and 322 may have different erase speeds.

During the erase operation, time points when the respective first to eighth drain select lines DSL1b, DSL2b, DSL3b, DSL4b, DSL5b, DSL6b, DSL7b, and DSL8b are floated may be caused to be different from each other to compensate for the erase speed difference between strings.

During the erase operation, time points when the respective first and second source select lines SSL1b and SSL2b are floated may be caused to be different from each other to compensate for the erase speed difference between strings.

Figure 8:
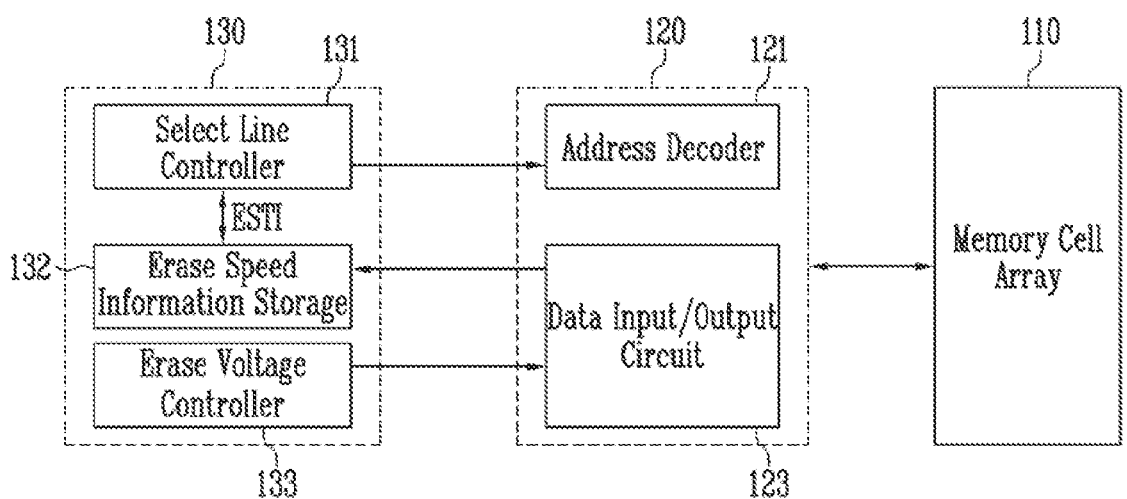
FIG. 8 is a diagram illustrating an operation of control logic according to an embodiment of the present disclosure.

FIG. 8 is a diagram illustrating an operation of control logic according to an embodiment of the present disclosure.

Referring to FIG. 8, the control logic 130 may include a select line controller 131, an erase speed information storage 132, and an erase voltage controller 133.

The select line controller 131 may control the peripheral circuit 120 so that floating time points of select lines connected to strings performing the erase operation are different from each other. For example, the select line controller 131 may float the select lines connected to the strings performing the erase operation at different time points based on erase speed test information ESTI stored in the erase speed storage 132. Specifically, the select line controller 131 may generate control signals for floating the select lines connected to the strings. At this time, the select line controller 131 may generate a control signal so that a select line connected to a string having a relatively slow erase speed is floated later than a select line connected to a string having a relatively fast erase speed.

As the select line controller 131 controls the peripheral circuit 120 so that the floating time points of the select lines are different from each other in the erase operation, an erase speed difference of the strings of the memory cell array 110 may be compensated.

In an embodiment, the erase speed test information ESTI may include information on an erase speed of the strings of the memory cell array 110. The information on the erase speed of the strings may be generated based on results of various tests performed in a test process of the memory device 100. The erase speed test information ESTI may be stored in any one of the memory blocks included in the memory device 100. The memory block in which the erase speed test information ESTI is stored may be a contents addressable memory (CAM) block. The CAM block may be read to the memory device 100 during a reset operation, and at this time, the erase speed test information ESI may be stored in the erase speed information storage 132.

The select line controller 131 may output control signals generated by the address decoder 121 of the peripheral circuit 120 to control the floating time points of the select lines.

The erase voltage controller 133 may control the peripheral circuit 120 to apply the erase voltage to a selected conductive line. The conductive line may be at least one of the bit line or the source line.

Figure 9:
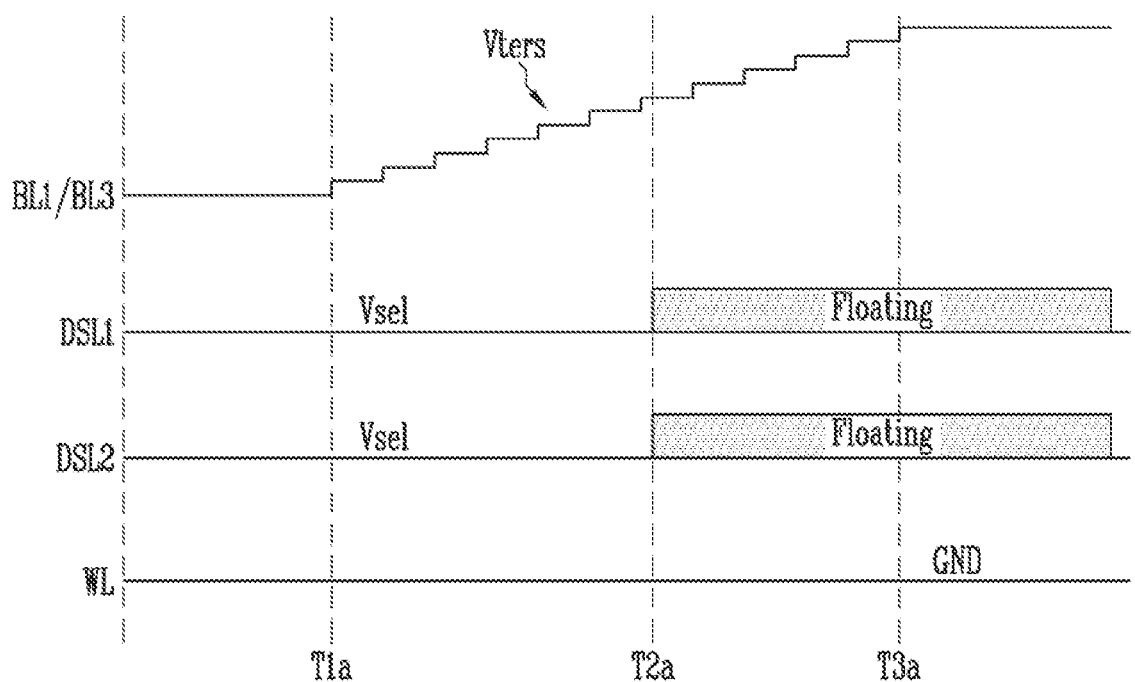
FIG. 9 is a diagram illustrating an erase speed test operation of a memory device according to an embodiment of the present disclosure.

FIG. 9 is a diagram illustrating an erase speed test operation of a memory device according to an embodiment of the present disclosure.

In the present erase speed test operation, an erase speed test operation on the first string ST1 and the third string ST3 of FIG. 3 is described.

Referring to FIGS. 3 and 9, the erase speed test operation may include first to third time points T1a, T2a, and T3a. The first to third time points T1a, T2a, and T3a may be time points sequentially passed in the erase speed test operation. The second time point T2a may be a time point later than the first time point T1a, and the third time point T3a may be a time point later than the second time point T2a.

In the erase speed test operation, a test erase voltage Vters may be applied to the first bit line BL1 connected to the first string ST1 and the third bit line BL3 connected to the third string ST3 from the first time point T1a. A time point at which the test erase voltage Vters starts to be applied to the first and third bit lines BL1 and BL3 may be defined as the first time point T1a. The test erase voltage Vters may be a positive voltage greater than 0V. The test erase voltage Vters may increase in a stepwise manner from the first time point T1a to the third time point T3a. A time point at which the test erase voltage Vters becomes a maximum may be defined as the third time point T3a. The test erase voltage Vters may be maintained at the maximum from the third time point T3a.

A select voltage Vsel may be applied to the first drain select line DSL1 connected to the drain select transistor of the first string ST1 and the second drain select line DSL2 connected to the drain select transistor of the third string ST3 before the first time point T1a to the second time point T2a. The select voltage Vsel may be a voltage less than the test erase voltage Vters. The select voltage Vsel may be 0V.

From the first time point T1a to the second time point T2a, a gate induced drain leakage GIDL may be generated in the first and third strings ST1 and ST3 by a potential difference between the test erase voltage Vters and the selected voltage Vsel, and hot holes may be injected into channels of the first and third strings ST1 and ST3 by the GIDL. Accordingly, a potential of the channels of the first and third strings ST1 and ST3 may increase.

From the second time point T2a, the first drain select line DSL1 and the second drain select line DSL2 may be floated. As the first and second drain select lines DSL1 and DSL2 are floated, a coupling between the channel of the first string ST1 and the first drain select line DSL1 may be generated and thus a potential of the first drain select line DSL1 may increase, and a coupling between the channel of the third string ST3 and the second drain select line DSL2 may be generated and thus a potential of the second drain select line DSL2 may increase.

As the test erase voltage Vters becomes the maximum from the third time point T3a, the hot holes injected into the channels of the first and third strings ST1 and ST3 may be tunneled, and thus the memory cells of the first and third strings ST1 and ST3 may be erased. Even though the first and second drain select lines DSL1 and DSL2 are floated at the same second time point T2a, a speed at which the memory cells of the first string ST1 are erased and a speed at which the memory cells of the third string ST3 are erased may be different. For example, the memory cells of the third string ST3 may be erased later than the memory cells of the first string ST1.

According to the erase speed test operation, the erase speed test information ESTI including information on the erase speed of the first and third strings ST1 and ST3 may be generated.

Figure 10:
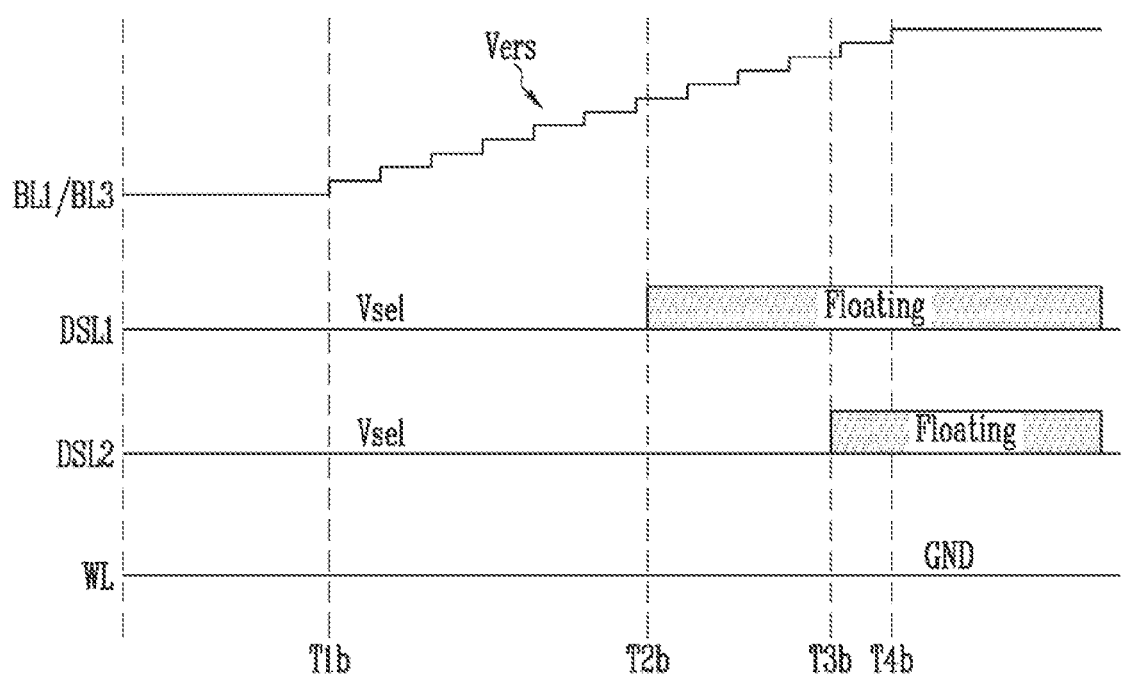
FIG. 10 is a diagram illustrating an erase operation of a memory device according to an embodiment of the present disclosure.

FIG. 10 is a diagram illustrating an erase operation of a memory device according to an embodiment of the present disclosure.

In the present erase operation, the erase operation on the first and third strings ST1 and ST3 of FIG. 3 is described. In the present erase operation, it is assumed that the erase speed test operation on the first and third strings ST1 and ST3 is performed first and the erase speed test information ESTI is stored in the erase speed information storage. In the previous erase speed test operation, it is assumed that the erase speed of the third string ST3 is slower than the erase speed of the first string ST1.

Referring to FIGS. 3 and 10, the erase operation may include first to fourth time points T1b, T2b, T3b, and T4b. The first to fourth time points T1b, T2b, T3b, and T4b may be time points sequentially passed in the erase operation. The second time point T2b may be a time point later than the first time point T1b, the third time point T3b may be a time point later than the second time point T2b, and the fourth time point T4b may be a time point later than the third time point T3b.

In the erase operation, the erase voltage Vers may be applied to the first bit line BL1 connected to the first string ST1 and the third bit line BL3 connected to the third string ST3 from the first time point T1b. A time point at which the erase voltage Vers starts to be applied to the first and third bit lines BL1 and BL3 may be defined as the first time point T1b. The erase voltage Vers may be a positive voltage greater than 0V. The erase voltage Vers may increase in a stepwise manner from the first time point T1b to the fourth time point T4b. A time point at which the erase voltage Vers becomes a maximum may be defined as the fourth time point T4b. The erase voltage Vers may be maintained at the maximum from the fourth time point T4b.

A select voltage Vsel may be applied to the first drain select line DSL1 connected to the drain select transistor of the first string ST1 from before the first time point T1b to the second time point T2b. From the first time point T1b to the second time point T2b, the GIDL may be generated in the first string ST1 by a potential difference between the erase voltage Vers and the select voltage Vsel, and hot holes may be injected into the channels of the string ST1 due to the GIDL. Accordingly, a potential of the channels of the first string ST1 may increase.

From the second time point T2b, the first drain select line DSL1 may be floated. As the first drain select line DSL1 is floated, a coupling between the channel of the first string ST1 and the first drain select line DSL1 may be generated, and thus a potential of the first drain select line DSL1 may increase. The first drain select line DSL1 may maintain a floating state from the second time point T2b to after the fourth time point T4b.

The select voltage Vsel may be applied to the second drain select line DSL2 connected to the drain select transistor of the third string ST3 from before the first time point T1b to the third time point T3b. From the first time point T1b to the third time point T3b, the GIDL may be generated in the third string ST3 by the potential difference between the erase voltage Vers and the select voltage Vsel, and the hot holes may be injected into the channels of the third string ST3 by the GIDL. Accordingly, a potential of the channels of the third string ST3 may increase.

From the third time point T3b, the second drain select line DSL2 may be floated. As the second drain select line DSL2 is floated, a coupling between the channel of the third string ST3 and the second drain select line DSL2 may be generated, and thus a potential of the second drain select line DSL2 may increase. The second drain select line DSL2 may maintain a floating state from the third time point T3b to after the fourth time point T4b.

As the third time point T3b for floating the second drain select line DSL2 is later than the second time point T2b for floating the first drain select line DSL1, the maximum potential difference between the erase voltage Vers and the select voltage Vsel of the third string ST3 may be greater than that of the first string ST1. Specifically, the a potential difference between the third bit line BL3 and the second drain select line DSL2 from the second time point T2b to the third time point T3b may be greater than a potential difference between the first bit line BL1 and the first drain select line DSL1 from the first time point T1b to the second time point T2b. Accordingly, the number of hot holes injected into the channel of the third string ST3 may be greater than the number of hot holes injected into the channel of the first string ST1.

As the erase voltage Vers becomes the maximum from the fourth time point T4b, the hot holes injected into the channels of the first and third strings ST1 and ST3 may be tunneled, and thus the memory cells of the first and third strings ST1 and ST3 may be erased. Because the number of hot holes injected into the channel of the third string ST3 is greater than the number of hot holes injected into the channel of the first string ST1, the erase speed difference between the first and third strings ST1 and ST3, which is checked in the previous erase speed test operation, may be compensated in the erase operation. In other words, the erase speed difference between the first and third strings ST1 and ST3 may be reduced in the erase operation.

Figure 11:
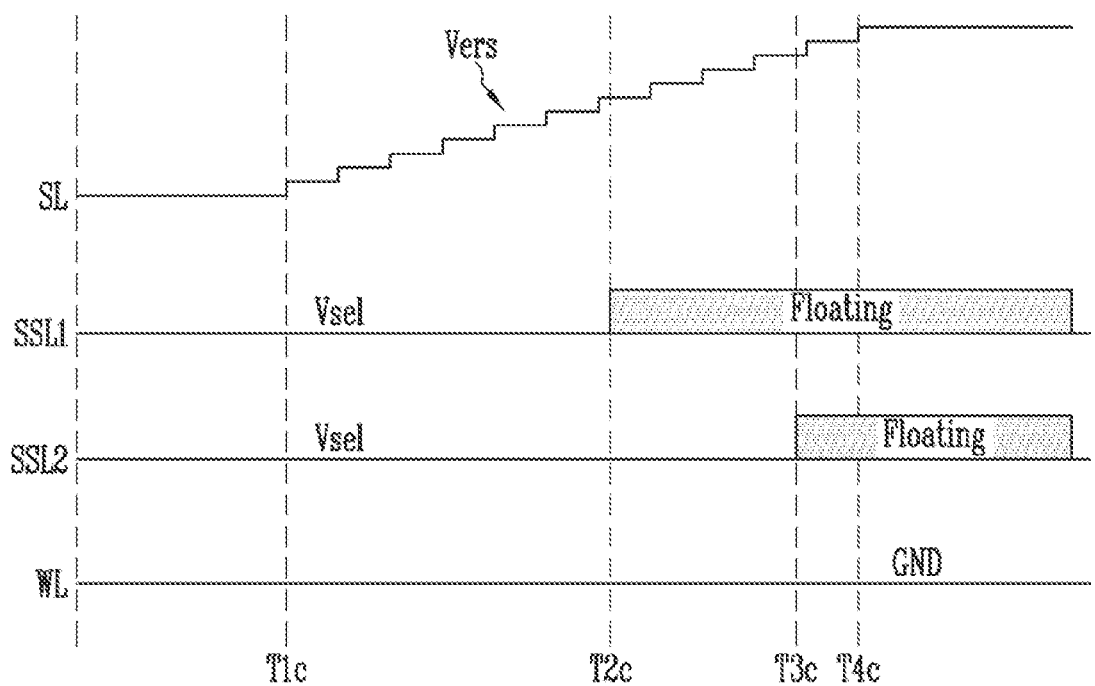
FIG. 11 is a diagram illustrating an erase operation of a memory device according to an embodiment of the present disclosure.

FIG. 11 is a diagram illustrating an erase operation of a memory device according to an embodiment of the present disclosure.

In the present erase operation, the erase operation on the first and fifth strings ST1 and ST5 of FIG. 3 is described. In the present erase operation, it is assumed that the erase speed test operation on the first and fifth strings ST1 and ST5 is performed first and the erase speed test information ESTI is stored in the erase speed information storage. In the previous erase speed test operation, it is assumed that the erase speed of the fifth string ST5 is slower than the erase speed of the first string ST1.

Referring to FIGS. 3 and 11, the erase operation may include first to fourth time points T1c, T2c, T3c, and T4c. The first to fourth time points T1c, T2c, T3c, and T4c may be time points sequentially passed in the erase operation. The second time point T2c may be a time point later than the first time point T1c, the third time point T3c may be a time point later than the second time point T2c, and the fourth time point T4c may be a time point later than the third time point T3c.

In the erase operation, the erase voltage Vers may be applied to the source line SL from the first time point T1c. A time point at which the erase voltage Vers starts to be applied to the source line SL may be defined as the first time point T1c. The erase voltage Vers may be a positive voltage greater than 0V. The erase voltage Vers may increase in a stepwise manner from the first time point T1c to the fourth time point T4c. A time point at which the erase voltage Vers becomes a maximum may be defined as the fourth time point T4c. The erase voltage Vers may be maintained at the maximum from the fourth time point T4c.

The select voltage Vse1 may be applied to the first source select line SSL1 connected to the source select transistor of the first string ST1 from before the first time point T1c to the second time point T2c. From the first time point T1c to the second time point T2c, the GIDL may be generated in the first string ST1 by a potential difference between the erase voltage Vers and the select voltage Vse1, and hot holes may be injected into the channels of the string ST1 due to the GIDL. Accordingly, a potential of the channels of the first string ST1 may increase.

From the second time point T2c, the first source select line SSL1 may be floated. As the first source select line SSL1 is floated, a coupling between the channel of the first string ST1 and the first source select line SSL1 may be generated, and thus a potential of the first source select line SSL1 may increase. The first source select line SSL1 may maintain a floating state from the second time point T2c to after the fourth time point T4c.

The select voltage Vse1 may be applied to the second source select line SSL2 connected to the source select transistor of the fifth string ST5 from before the first time point T1c to the third time point T3c. From the first time point T1c to the third time point T3c, the GIDL may be generated in the fifth string ST5 by the potential difference between the erase voltage Vers and the select voltage Vse1, and the hot holes may be injected into the channels of the fifth string ST5 by the GIDL. Accordingly, a potential of the channels of the fifth string ST5 may increase.

From the third time point T3c, the second source select line SSL2 may be floated. As the second source select line SSL2 is floated, a coupling between the channel of the fifth string ST5 and the second source select line SSL2 may be generated, and thus a potential of the second source select line SSL2 may increase. The second source select line SSL2 may maintain a floating state from the third time point T3c to after the fourth time point T4c.

As the third time point T3c for floating the second source select line SSL2 is later than the second time point T2c for floating the first source select line SSL1, the maximum potential difference between the erase voltage Vers and the select voltage Vse1 of the fifth string ST5 may be greater than that of the first string ST1. Specifically, a potential difference between the source line SL and the second source select line SSL2 from the second time point T2c to the third time point T3c may be greater than a potential difference between the source line SL and the first source select line SSL1 from the first time point T1c to the second time point T2c. Accordingly, the number of hot holes injected into the channel of the fifth string ST5 may be greater than the number of hot holes injected into the channel of the first string ST1.

As the erase voltage Vers becomes the maximum from the fourth time point T4c, the hot holes injected into the channels of the first and fifth strings ST1 and ST5 may be tunneled, and thus the memory cells of the first and fifth strings ST1 and ST5 may be erased. Because the number of hot holes injected into the channel of the fifth string ST5 is greater than the number of hot holes injected into the channel of the first string ST1, the erase speed difference between the first and fifth strings ST1 and ST5, which is checked in the previous erase speed test operation, may be compensated in the erase operation. In other words, the erase speed difference between the first and fifth strings ST1 and ST5 may be reduced in the erase operation.

Figure 12:
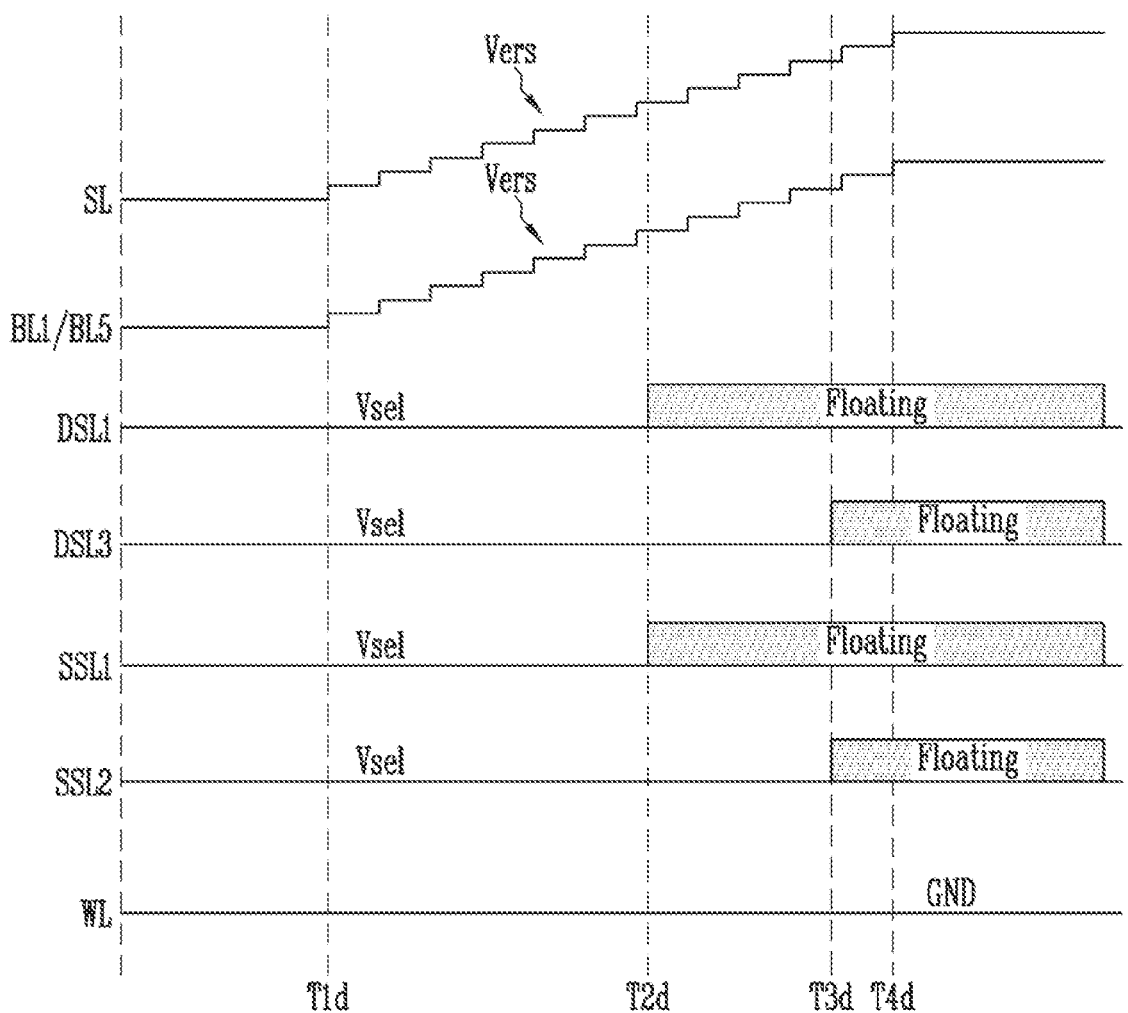
FIG. 12 is a diagram illustrating an erase operation of a memory device according to an embodiment of the present disclosure.

FIG. 12 is a diagram illustrating an erase operation of a memory device according to an embodiment of the present disclosure.

In the present erase operation, the erase operation on the first and fifth strings ST1 and ST5 of FIG. 3 is described. In the present erase operation, it is assumed that the erase speed test operation on the first and fifth strings ST1 and ST5 is performed first and the erase speed test information ESTI is stored in the erase speed information storage. In the erase speed test operation, it is assumed that the erase speed of the fifth string ST5 is slower than the erase speed of the first string ST1.

Referring to FIGS. 3 and 12, the erase operation may include first to fourth time points T1d, T2d, T3d, and T4d. The first to fourth time points T1d, T2d, T3d, and T4d may be time points sequentially passed in the erase operation. The second time point T2d may be a time point later than the first time point T1d, the third time point T3d may be a time point later than the second time point T2d, and the fourth time point T4d may be a time point later than the third time point T3d.

In the erase operation, the erase voltage Vers may be applied to the source line SL, the first bit line BL1 connected to the first string ST1, and the fifth bit line BL5 connected to the fifth string ST5 from the first time point T1d. A time point at which the erase voltage Vers starts to be applied to the source line SL, the first bit line BL1, and the fifth bit line BL5 may be defined as the first time point T1$d$. The erase voltage Vers may be a positive voltage greater than 0V. The erase voltage Vers may increase in a stepwise manner from the first time point T1$d$ to the fourth time point T4$d$. A time point at which the erase voltage Vers becomes a maximum may be defined as the fourth time point T4$d$. The erase voltage Vers may be maintained at the maximum from the fourth time point T4$d$.

The select voltage Vse1 may be applied to the first source select line SSL1 connected to the source select transistor of the first string ST1 and the first drain select line DSL1 connected to the drain select transistor from before the first time point T1$d$ to the second time point T2$d$. From the first time point T1$d$ to the second time point T2$d$, the GIDL may be generated in the first string ST1 by a potential difference between the erase voltage Vers and the select voltage Vse1, and hot holes may be injected into the channels of the string ST1 due to the GIDL. Accordingly, a potential of the channels of the first string ST1 may increase.

From the second time point T2$d$, the first source select line SSL1 and the first drain select line DSL1 may be floated. As the first source select line SSL1 and the first drain select line DLS1 are floated, a coupling between the channel of the first string ST1 and the first source select line SSL1 and a coupling between the channel of the first string ST1 and the first drain select line DLS1 may be generated, and thus a potential of the first source select line SSL1 and the first drain select line DLS1 may increase. The first source select line SSL1 and the first drain select line DLS1 may maintain a floating state from the second time point T2$d$ to after the fourth time point T4$d$.

The select voltage Vse1 may be applied to the second source select line SSL2 connected to the source select transistor and the third drain select line DSL3 connected to the drain select transistor from before the first time point T1$d$ to the third time point T3$d$. From the first time point T1$d$ to the third time point T3$d$, the GIDL may be generated in the fifth string ST5 by the potential difference between the erase voltage Vers and the select voltage Vse1, and the hot holes may be injected into the channels of the fifth string ST5 by the GIDL. Accordingly, a potential of the channels of the fifth string ST5 may increase.

From the third time point T3$d$, the second source select line SSL2 and the third drain select line DSL3 may be floated. As the second source select line SSL2 and the third drain select line DSL3 are floated, a coupling between the channel of the fifth string ST5 and the second source select line SSL2 and a coupling between the channel of the fifth string ST5 and the third drain select line DSL3 may be generated, and thus a potential of the second source select line SSL2 and the third drain select line DSL3 may increase. The second source select line SSL2 and the third drain select line DSL3 may maintain a floating state from the third time point T3$d$ to after the fourth time point T4$d$.

As the third time point T3$d$ for floating the second source select line SSL2 and the third drain select line DSL3 is later than the second time point T2$d$ for floating the first source select line SSL1 and the first drain select line DSL1, the maximum potential difference between the erase voltage Vers and the select voltage Vse1 of the fifth string ST5 may be greater than that of the first string ST1. Specifically, a potential difference between the fifth bit line BL5 and the third drain select line DSL3 and a potential difference between the source line SL and the second source select line SSL2 from the second time point T2$d$ to the third time point T3$d$ may be greater than a potential difference between the first bit line BL1 and the first drain select line DSL1 and a potential difference between the source line SL and the first source select line SSL1 from the first time point T1$d$ to the second time point T2$d$. Accordingly, the number of hot holes injected into the channel of the fifth string ST5 may be greater than the number of hot holes injected into the channel of the first string ST1.

As the erase voltage Vers becomes the maximum from the fourth time point T4$d$, the hot holes injected into the channels of the first and fifth strings ST1 and ST5 may be tunneled, and thus the memory cells of the first and fifth strings ST1 and ST5 may be erased. Because the number of hot holes injected into the channel of the fifth string ST5 is greater than the number of hot holes injected into the channel of the first string ST1, the erase speed difference between the first and fifth strings ST1 and ST5, which is checked in the previous erase speed test operation, may be compensated in the erase operation. In other words, the erase speed difference between the first and fifth strings ST1 and ST5 may be reduced in the erase operation.

Figure 13:
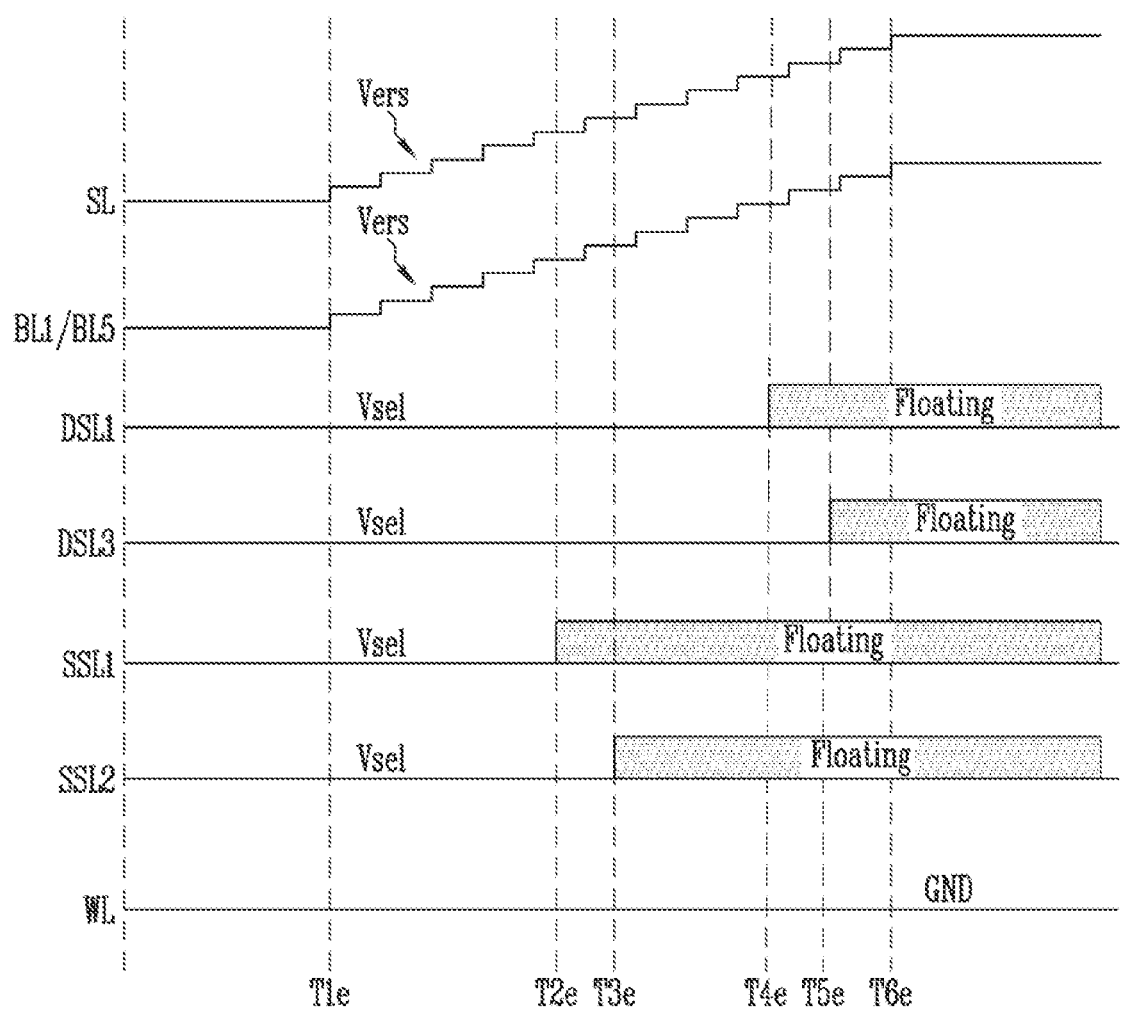
FIG. 13 is a diagram illustrating an erase operation of a memory device according to an embodiment of the present disclosure.

FIG. 13 is a diagram illustrating an erase operation of a memory device according to an embodiment of the present disclosure.

In the present erase operation, the erase operation on the first and fifth strings ST1 and ST5 of FIG. 3 is described. In the present erase operation, it is assumed that the erase speed test operation on the first and fifth strings ST1 and ST5 is performed first and the erase speed test information ESTI is stored in the erase speed information storage. In the erase speed test operation, it is assumed that the erase speed of the fifth string ST5 is slower than the erase speed of the first string ST1.

Referring to FIGS. 3 and 13, the erase operation may include first to sixth time points T1$e$, T2$e$, T3$e$, T4$e$, T5$e$, and T6$e$, and the first to sixth time points T1$e$, T2$e$, T3$e$, T4$e$, T5$e$, and T6$e$ may be time points sequentially passed in the erase operation. The second time point T2$e$ may be a time point later than the first time point T1$e$, the third time point T3$e$ may be a time point later than the second time point T2$e$, the fourth time point T4$e$ may be a time point later than the third time point T3$e$, the fifth time point T5$e$ may be a time point later than the fourth time point T4$e$, and the sixth time point T6$e$ may be a time point later than the fifth time point T5$e$.

In the erase operation, the erase voltage Vers may be applied to the source line SL, the first bit line BL1 connected to the first string ST1, and the fifth bit line BL5 connected to the fifth string ST5 from the first time point T1$e$. A time point at which the erase voltage Vers starts to be applied to the source line SL, the first bit line BL1, and the fifth bit line BL5 may be defined as the first time point T1$e$. The erase voltage Vers may be a positive voltage greater than 0V. The erase voltage Vers may increase in a stepwise manner from the first time point T1$e$ to the sixth time point T6$e$. A time point at which the erase voltage Vers becomes a maximum may be defined as the sixth time point T6$e$. The erase voltage Vers may be maintained at the maximum from the sixth time point T6$e$.

The first source select line SSL1 may be floated from the second time point T2$e$ and maintain a floating state to after the sixth time point T6$e$. The second source select line SSL2 may be floated from the third time point T3$e$ and maintain a floating state to after the sixth time point T6$e$. The first drain select line DSL1 may be floated from the fourth time point T4$e$ and maintain a floating state to after the sixth time point T6$e$. The third drain select line DSL3 may be floated from the fifth time point T5*e* and maintain a floating state to after the sixth time point T6*e*.

As the time point for floating the second source select line SSL2 is later than the time point for floating the first source select line SSL1 and the time point for floating the third drain select line DLS3 is later than the time point for floating the first drain select line DSL1, the erase speed difference between the first and fifth strings ST1 and ST5, which is checked in the previous erase speed test operation may be compensated in the erase operation. In other words, the erase speed difference between the first and fifth strings ST1 and ST5 may be reduced in the erase operation.

Figure 14:
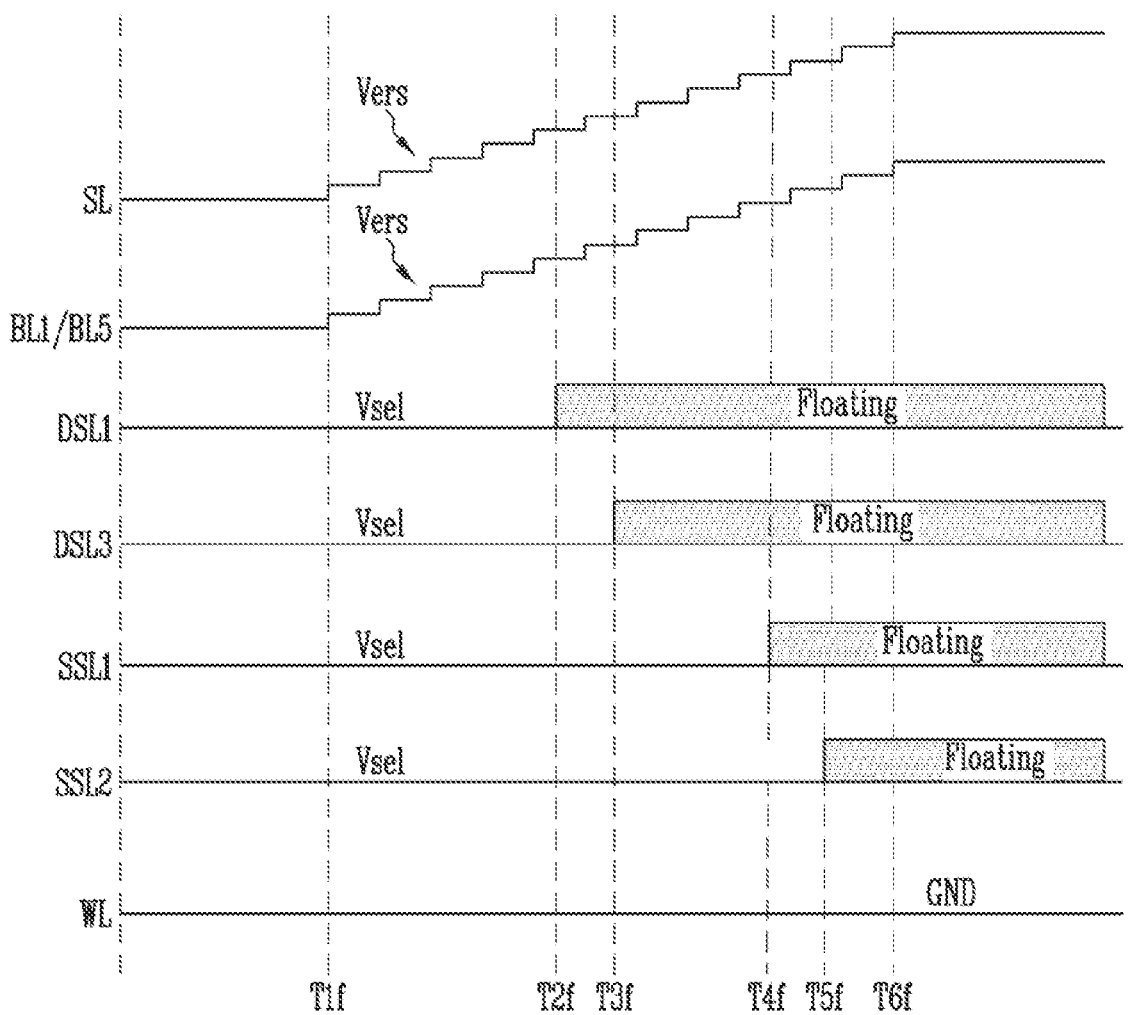
FIG. 14 is a diagram illustrating an erase operation of a memory device according to an embodiment of the present disclosure.

FIG. 14 is a diagram illustrating an erase operation of a memory device according to an embodiment of the present disclosure.

In the present erase operation, the erase operation on the first and fifth strings ST1 and ST5 of FIG. 3 is described. In the present erase operation, it is assumed that the erase speed test operation on the first and fifth strings ST1 and ST5 is performed first and the erase speed test information ESTI is stored in the erase speed information storage. In the erase speed test operation, it is assumed that the erase speed of the fifth string ST5 is slower than the erase speed of the first string ST1.

Referring to FIGS. 3 and 14, the erase operation may include first to sixth time points T1*f*, T2*f*, T3*f*, T4*f*, T5*f*, and T6*f*, and the first to sixth time points T1*f*, T2*f*, T3*f*, T4*f*, T5*f*, and T6*f* may be time points sequentially passed in the erase operation. The second time point T2*f* may be a time point later than the first time point T1*f*, the third time point T3*f* may be a time point later than the second time point T2*f*, the fourth time point T4*f* may be a time point later than the third time point T3*f*, the fifth time point T5*f* may be a time point later than the fourth time point T4*f*, and the sixth time point T6*f* may be a time point later than the fifth time point T5*f*.

In the erase operation, the erase voltage Vers may be applied to the source line SL, the first bit line BL1 connected to the first string ST1, and the fifth bit line BL5 connected to the fifth string ST5 from the first time point T1*f*. A time point at which the erase voltage Vers starts to be applied to the source line SL, the first bit line BL1, and the fifth bit line BL5 may be defined as the first time point T1*f*. The erase voltage Vers may be a positive voltage greater than 0V. The erase voltage Vers may increase in a stepwise manner from the first time point T1*f* to the sixth time point T6*f*. A time point at which the erase voltage Vers becomes a maximum may be defined as the sixth time point T6*f*. The erase voltage Vers may be maintained at the maximum from the sixth time point T6*f*.

The first drain select line DSL1 may be floated from the second time point T2*f* and maintain a floating state to after the sixth time point T6*f*. The third drain select line DSL3 may be floated from the third time point T3*f* and maintain a floating state to after the sixth time point T6*f*. The first source select line SSL1 may be floated from the fourth time point T4*f* and maintain a floating state to after the sixth time point T6*f*. The second source select line SSL2 may be floated from the fifth time point T5*f* and maintain a floating state to after the sixth time point T6*f*.

As the time point for floating the second source select line SSL2 is later than the time point for floating the first source select line SSL1 and the time point for floating the third drain select line DLS3 is later than the time point for floating the first drain select line DSL1, the erase speed difference between the first and fifth strings ST1 and ST5, which is checked in the previous erase speed test operation may be compensated in the erase operation. In other words, the erase speed difference between the first and fifth strings ST1 and ST5 may be reduced in the erase operation.

Figure 15:
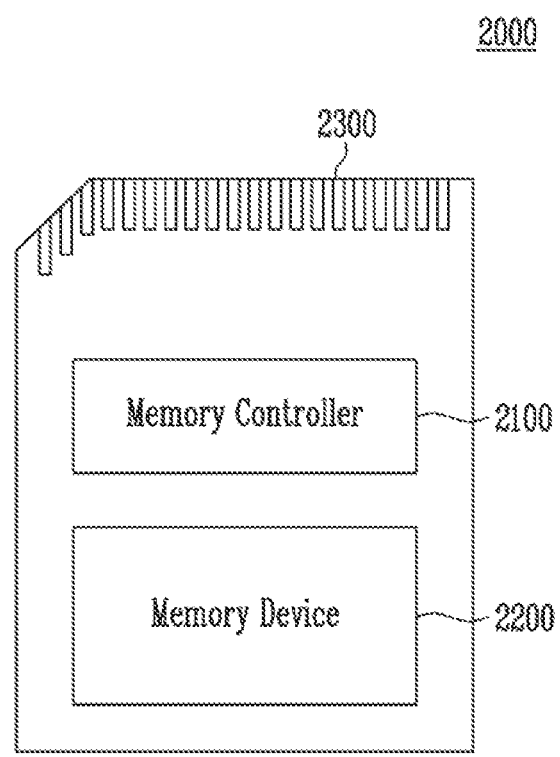
FIG. 15 a block diagram illustrating a memory card system to which the storage device according to an embodiment of the present disclosure is applied.

FIG. 15 is a block diagram illustrating a memory card system to which the storage device according to an embodiment of the present disclosure is applied.

Referring to FIG. 15, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 is configured to perform a read operation, a program operation, and an erase operation or control a background operation of the memory device 2200. The memory controller 2100 is configured to provide an interface between the memory device 2200 and a host. The memory controller 2100 is configured to drive firmware for controlling the memory device 2200. The memory controller 2100 may be implemented equally to the memory controller 200 described with reference to FIG. 1.

For example, the memory controller 2100 may include components such as random access memory (RAM), a processor, a host interface, a memory interface, and an error corrector.

The memory controller 2100 may communicate with an external device through the connector 2300. The memory controller 2100 may communicate with an external device (for example, the host) according to a specific communication standard. For example, the memory controller 2100 is configured to communicate with an external device through at least one of various communication standards such as a universal serial bus (USB), a multimedia card (MMC), an embedded MMC (MCM), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe. For example, the connector 2300 may be defined by at least one of the various communication standards described above.

For example, the memory device 2200 may be implemented with various non-volatile memory elements, such as electrically erasable and programmable ROM (EEPROM), NAND flash memory, NOR flash memory, phase-change RAM (PRAM), resistive RAM (ReRAM), ferroelectric RAM (FRAM), and spin transfer torque magnetic RAM (STT-MRAM).

For example, the memory controller 2100 or the memory device 2200 may be packaged and provided as one semiconductor package in a method such as a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline integrated circuit package (SOIC), a shrink small outline package (SSOP), a thin small outline package (TSOP), a system in package (SIP), a multi-chip package (MCP), a wafer-level fabricated package (WFP), or a wafer-level processed stack package (WSP). Alternatively, the memory device 2200 may include a plurality of non-volatile memory chips, and the plurality of non-volatile memory chips may be packaged and provided as one semiconductor package based on the above-described package methods.

For example, the memory controller 2100 and the memory device 2200 may be integrated into one semiconductor device. For example, the memory controller 2100 and the memory device 2200 may be integrated into one semiconductor device to configure a solid state drive (SSD). The memory controller 2100 and the memory device 2200 may be integrated into one semiconductor device to configure a memory card. For example, the memory controller 2100 and the memory device 2200 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

For example, the memory device 2200 may be the memory device 100 described with reference to FIG. 1.

Figure 16:
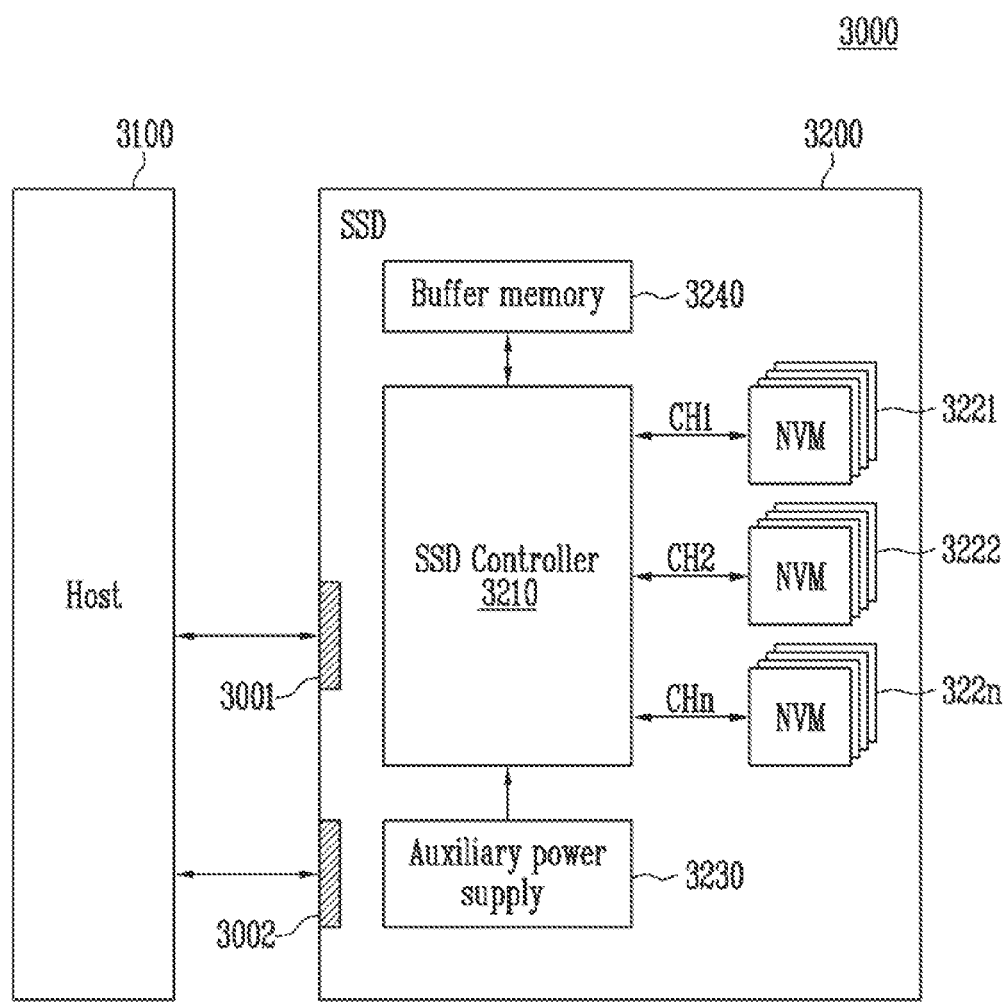
FIG. 16 is a block diagram illustrating a solid state drive (SSD) system to which the storage device according to an embodiment of the present disclosure is applied.

FIG. 16 is a block diagram illustrating a solid state drive (SSD) system to which the storage device according to an embodiment of the present disclosure is applied.

Referring to FIG. 16, the SSD system 3000 includes a host 3100 and an SSD 3200. The SSD 3200 exchanges a signal SIG with the host 3100 through a signal connector 3001 and receives power PWR through a power connector 3002. The SSD 3200 includes an SSD controller 3210, a plurality of flash memories 3221 to 322n, an auxiliary power supply 3230, and a buffer memory 3240.

In an embodiment, the SSD controller 3210 may perform the function of the memory controller 200 described with reference to FIG. 1.

The SSD controller 3210 may control the plurality of flash memories 3221 to 322n in response to the signal SIG received from the host 3100. For example, the signal SIG may be signals based on an interface between the host 3100 and the SSD 3200. For example, the signal SIG may be a signal defined by at least one of interfaces such as a universal serial bus (USB), a multimedia card (MMC), an embedded MMC (MCM), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

The auxiliary power supply 3230 is connected to the host 3100 through the power connector 3002. The auxiliary power supply 3230 may receive the power PWR from the host 3100 and may charge the power PWR. The auxiliary power supply 3230 may provide power of the SSD 3200 when power supply from the host 3100 is not smooth. For example, the auxiliary power supply 3230 may be positioned in the SSD 3200 or may be positioned outside the SSD 3200. For example, the auxiliary power supply 3230 may be positioned on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or may temporarily store metadata (for example, a mapping table) of the flash memories 3221 to 322n. The buffer memory 3240 may include volatile memory, such as DRAM, SDRAM, DDR SDRAM, LPDDR SDRAM, and GRAM, or non-volatile memory, such as FRAM, ReRAM, STT-MRAM, and PRAM.

For example, the non-volatile memories 3321 to 322n may be the memory device 100 described with reference to FIG. 1.

FIG. 17 is a block diagram illustrating a user system to which the storage device according to an embodiment of the present disclosure is applied.

Referring to FIG. 17, the user system 4000 includes an application processor 4100, a memory module 4200, a network module 4300, a storage module 4400, and a user interface 4500.

The application processor 4100 may drive components, an operating system (OS), a user program, or the like included in the user system 4000. For example, the application processor 4100 may include controllers, interfaces, graphics engines, and the like that control the components included in the user system 4000. The application processor 4100 may be provided as a system-on-chip (SoC).

The memory module 4200 may operate as a main memory, an operation memory, a buffer memory, or a cache memory of the user system 4000. The memory module 4200 may include volatile random access memory, such as DRAM, SDRAM, DDR SDRAM, DDR2 SDRAM, DDR3 SDRAM, LPDDR SDARM, LPDDR2 SDRAM, and LPDDR3 SDRAM, or non-volatile random access memory, such as PRAM, ReRAM, MRAM, and FRAM. For example, the application processor 4100 and memory module 4200 may be packaged based on a package on package (POP) and provided as one semiconductor package.

The network module 4300 may communicate with external devices. For example, the network module 4300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, and WI-FI. For example, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. For example, the storage module 4400 may be implemented with a non-volatile semiconductor memory element using phase-change RAM (PRAM), magnetic RAM (MRAM), resistive RAM (RRAM), NAND flash, NOR flash, or three-dimensional NAND flash. For example, the storage module 4400 may be provided as a removable storage device (removable drive), such as a memory card, and an external drive of the user system 4000.

For example, the storage module 4400 may include a plurality of non-volatile memory devices, and the plurality of non-volatile memory devices may be the memory device 100 described with reference to FIG. 1.

The user interface 4500 may include interfaces for inputting data or an instruction to the application processor 4100 or for outputting data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light emitting diode (OLED) display device, an active matrix OLED (AMOLED) display device, an LED, a speaker, and a monitor.

What is claimed is:

1. A memory device comprising:
a first string including a plurality of first memory cells, and a first select transistor connected between a first conductive line and the plurality of first memory cells;
a second string including a plurality of second memory cells, and a second select transistor connected between the first conductive line and the plurality of second memory cells;
a peripheral circuit configured to perform an erase operation of the first and second strings; and
control logic configured to control the peripheral circuit to, during the erase operation:
apply a first erase voltage to the first conductive line;
float a first select line connected to the first select transistor after the first erase voltage is applied; and
float a second select line connected to the second select transistor after the first select line is floated.

2. The memory device of claim 1, wherein the first and second select lines are drain select lines.

3. The memory device of claim 1, wherein the first and second select lines are source select lines.

4. The memory device of claim 1, wherein:
the first string further includes a third select transistor connected between a second conductive line and the plurality of first memory cells;
the second string further includes a fourth select transistor connected between the second conductive line and the plurality of second memory cells; and
the control logic is configured to control the peripheral circuit to, during the erase operation:
apply a second erase voltage to the second conductive line;
float a third select line connected to the third select transistor after the second erase voltage is applied; and
float a fourth select line connected to the fourth select transistor after the third select line is floated.

5. The memory device of claim 4, wherein the control logic is configured to control the peripheral circuit to:
simultaneously float the first select line and the third select line; and
simultaneously float the second select line and the fourth select line.

6. The memory device of claim 4, wherein the control logic is configured to control the peripheral circuit to:
float the first select line and the third select line at different time points; and
float the second select line and the fourth select line at different time points.

7. The memory device of claim 1, further comprising:
first and second slit structures adjacent to each other; and
a separation layer between the first and second slit structures,
wherein the first select line is disposed between the first slit structure and the separation layer, and
the second select line is disposed between the second slit structure and the separation layer.

8. A memory device comprising:
a first string including a plurality of first memory cells, and a first select transistor connected between a first conductive line and the plurality of first memory cells;
a second string including a plurality of second memory cells, and a second select transistor connected between a second conductive line and the plurality of second memory cells;
a peripheral circuit configured to perform an erase operation of the first and second strings; and
control logic configured to control the peripheral circuit to, during the erase operation:
apply an erase voltage to the first and second conductive lines;
float a first select line connected to the first select transistor after the erase voltage is applied; and
float a second select line connected to the second select transistor after the first select line is floated.

9. The memory device of claim 8, wherein the control logic is configured to control the peripheral circuit so that the erase voltage is increased in a stepwise manner from a first time point to a second time point.

10. The memory device of claim 9, wherein the control logic is configured to control the peripheral circuit to:
float the first select line at a third time point between the first time point and the second time point; and
float the second select line at a fourth time point between the first time point and the second time point.

11. The memory device of claim 8, wherein:
the peripheral circuit is further configured to perform an erase speed test operation of the first and second strings; and
the control logic is configured to control the peripheral circuit to generate erase speed test information based on a result of the erase speed test operation.

12. The memory device of claim 11, wherein the control logic is configured to control the peripheral circuit so that floating time points of the first and second select lines are different from each other based on the erase speed test information during the erase operation.

13. The memory device of claim 11, wherein the erase speed test information includes information on an erase speed of the first and second strings.

14. The memory device of claim 11, further comprising:
a CAM block in which the erase speed test information is stored.

15. A memory device comprising:
a plurality of memory blocks, wherein each of the plurality of memory blocks includes a plurality of strings, wherein each of the plurality of strings includes a plurality of memory cells and a select transistor connected between a conductive line and the plurality of memory cells;
an erase speed information storage configured to store information on an erase speed of the plurality of strings;
a peripheral circuit configured to perform an erase operation of erasing data stored in the memory cells included in the plurality of strings; and
control logic configured to control the peripheral circuit to float select lines respectively connected to the select transistors included in the plurality of strings, based on the information on the erase speed, during the erase operation.

16. The memory device of claim 15, wherein the control logic is configured to control the peripheral circuit to float the select line connected to a selection transistor included in a string having a faster erase speed among the select transistors.

17. The memory device of claim 15, wherein the conductive line is a source line commonly connected to the plurality of strings.

18. The memory device of claim 15, wherein the conductive line is any one of bit lines respectively connected to the plurality of strings.

19. The memory device of claim 15, wherein the control logic is configured to control the peripheral circuit to apply an erase voltage to the conductive line during the erase operation.

20. The memory device of claim 19, wherein the control logic is configured to control the peripheral circuit so that the erase voltage is increased in a stepwise manner during the erase operation.

* * * * *